United States Patent
Lee et al.

(10) Patent No.: US 12,464,892 B2
(45) Date of Patent: Nov. 4, 2025

(54) DISPLAY APPARATUS INCLUDING A FIRST DISPLAY AREA AND A SECOND DISPLAY AREA

(71) Applicant: Samsung Display Co., Ltd., Yongin-si (KR)

(72) Inventors: Hyeonbum Lee, Yongin-si (KR); Junghyun Cho, Yongin-si (KR); Beohmrock Choi, Yongin-si (KR); Chiwook An, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 761 days.

(21) Appl. No.: 17/586,681

(22) Filed: Jan. 27, 2022

(65) Prior Publication Data
US 2023/0031015 A1    Feb. 2, 2023

(30) Foreign Application Priority Data
Jul. 27, 2021    (KR) ........................ 10-2021-0098533

(51) Int. Cl.
*H10K 59/121*    (2023.01)
*H10K 50/86*    (2023.01)
*H10K 59/122*    (2023.01)
*H10K 59/80*    (2023.01)

(52) U.S. Cl.
CPC ......... *H10K 59/121* (2023.02); *H10K 50/865* (2023.02); *H10K 59/122* (2023.02); *H10K 59/8792* (2023.02)

(58) Field of Classification Search
CPC .. H10K 59/121; H10K 50/865; H10K 59/122; H10K 59/353; H10K 59/40; H10K 59/8792; H10K 59/35; H10K 50/125; H10K 50/86
See application file for complete search history.

(56) References Cited

U.S. PATENT DOCUMENTS

| 5,869,929 | A | 2/1999 | Eida et al. |
| 7,898,175 | B2 | 3/2011 | Yoon et al. |
| 10,937,361 | B2 | 3/2021 | Hughes et al. |

(Continued)

FOREIGN PATENT DOCUMENTS

| CN | 111900263 A | * 11/2020 | ......... H01L 27/3241 |
| JP | 2020-42280 A | 3/2020 | |

(Continued)

OTHER PUBLICATIONS

English Machine Translation of Chinese Pub. No. CN 111900263 (Year: 2024).*

*Primary Examiner* — Donald L Raleigh
(74) *Attorney, Agent, or Firm* — Womble Bond Dickinson (US) LLP

(57) ABSTRACT

The present disclosure provides a display apparatus including a substrate, a first display area arranged on the substrate, and a second display area arranged on the substrate. The first display area includes a plurality of first pixel areas, and a plurality of first transmission areas respectively arranged to correspond to the plurality of first pixel areas to transmit light emitted from the plurality of first pixel areas, respectively, at least a portion of one of the plurality of first pixel areas is arranged to protrude from an edge of a planar shape of one of the plurality of first transmission areas.

20 Claims, 26 Drawing Sheets

(56) References Cited

U.S. PATENT DOCUMENTS

2021/0327972 A1* 10/2021 Lou ..................... G09G 3/3225
2023/0180587 A1*  6/2023 Liu .................... H10K 59/8792
                                                             257/40

FOREIGN PATENT DOCUMENTS

| KR | 10-0529450 B1 | 11/2000 |
| KR | 10-0795816 B1 | 1/2008 |
| KR | 10-2019-0036936 A | 4/2019 |

* cited by examiner

DISPLAY APPARATUS INCLUDING A FIRST DISPLAY AREA AND A SECOND DISPLAY AREA

CROSS-REFERENCE TO RELATED APPLICATION

This application claims priority to and the benefit of Korean Patent Application No. 10-2021-0098533, filed on Jul. 27, 2021, in the Korean Intellectual Property Office (KIPO), the entire disclosure of which is incorporated by reference herein.

BACKGROUND

1. Field

One or more embodiments relate to an apparatus, and more particularly, to a display apparatus.

2. Description of the Related Art

Mobile electronic devices have been widely used. As mobile electronic devices, tablet personal computers (PCs) have been broadly used in recent times, in addition to small electronic devices, such as mobile phones.

Such mobile electronic devices include display apparatuses to provide a user with visual information such as an image or a video, in order to support various functions. Recently, with the miniaturization of various components for driving a display apparatus, the importance of the display apparatus for an electronic device has continually increased, and a structure to bend a flat display apparatus to have a predetermined angle has been developed.

SUMMARY

When light emitted from a display element proceeds in a direction oblique with respect to a front surface of a display apparatus, the light emitted from the display element may reach not only a user of the display apparatus, but also others around the user. Thus, information provided by the display apparatus may be shared with others.

Aspects of one or more embodiments of the present disclosure are directed toward a display apparatus capable of reducing the amount of light, emitted from a display element, and proceeding in a sloping direction with respect to a front surface of the display apparatus.

Additional aspects will be set forth in part in the description which follows and, in part, will be apparent from the description, or may be learned by practice of the presented embodiments of the disclosure.

According to one or more embodiments, a display apparatus includes a substrate, a first display area arranged on the substrate, and a second display area arranged on the substrate. The first display area includes a plurality of first pixel areas, and a plurality of first transmission areas respectively arranged to correspond to the plurality of first pixel areas to transmit light emitted from the plurality of first pixel areas, respectively, in a plan view, at least a portion of one of the plurality of first pixel areas is arranged to protrude from an edge of a planar shape of one of the plurality of first transmission areas, the one of the plurality of first transmission areas corresponding to the one of the plurality of first pixel areas, and an area of a planar shape of each of the first pixel areas is different from an area of a planar shape of a second pixel area arranged on the second display area, the second pixel area emits a same color of light as the first pixel area.

In the plan view, the first transmission areas or the first pixel areas may have a rectangular shape.

In the plan view, the first transmission areas or the first pixel areas may have a square shape or a diamond shape.

In the plan view, the first pixel areas may have a square shape or a diamond shape, and the first transmission areas may have a rectangular shape.

In the plan view, one of the plurality of first pixel areas may protrude from an edge of the first transmission area corresponding to the one of the plurality of first pixel areas in a first direction, and another of the plurality of first pixel areas may protrude from an edge of the first transmission area corresponding to the other of the plurality of first pixel areas in a second direction.

The first pixel areas and the first transmission areas each may have a square shape or a diamond shape. In a plan view, one of the plurality of first pixel areas may protrude from an edge of the first transmission area corresponding to the one of the plurality of first pixel areas in a first direction and a second direction.

In the plan view, another of the plurality of first pixel areas may be arranged in the first transmission area corresponding to the other of the plurality of first pixel areas.

The second display area may be adjacent to the first display area.

The first display area may include a plurality of first display areas. The second display area may include a plurality of second display areas. The plurality of first display areas may be alternately arranged with the plurality of second display areas along a first direction.

In the plan view, the first pixel areas respectively arranged on the first display areas may respectively protrude from edges of the first transmission areas respectively arranged to correspond to the first pixel areas, in a same direction.

In the plan view, the first pixel areas respectively arranged on the first display areas adjacent to each other may respectively protrude from edges of the first transmission areas respectively arranged to correspond to the first pixel areas, in different directions from each other.

In the plan view, the first pixel areas may have a rectangular shape. The first transmission areas may have a square shape or a diamond shape.

In the plan view, one of the plurality of first pixel areas may protrude in a first direction from an edge of the first transmission area corresponding to the one of the plurality of first pixel areas, and another of the plurality of first pixel areas may protrude in a second direction from an edge of the first transmission area corresponding to the other of the plurality of first pixel areas.

According to one or more embodiments, a display apparatus includes a substrate including a first display area and a second display area, a pixel-defining layer arranged on the substrate, the pixel-defining layer including at least one first opening portion arranged in the first display area and at least one second opening portion arranged in the second display area, and a light blocking layer arranged on the pixel-defining layer, the light blocking layer including one or more holes corresponding to the at least one first opening portion and an opening area corresponding to the second display area. In a plan view, a size of the at least one first opening portion and a size of the one or more holes are different from each other, and at least one of edges of the at least one first opening portion is arranged outside at least one of edges of the one or more holes.

In the plan view, the at least one first opening portion or the one or more holes may have a rectangular shape.

In the plan view, the at least one first opening portion or the one or more holes may have a square shape or a diamond shape.

In the plan view, one of the at least one first opening portion and the one or more holes may have a rectangular shape, and the other of the at least one first opening portion and the one or more holes may have a square shape. The at least one first opening portion arranged in the first display area may include a plurality of first opening portions. The at least one second opening portion arranged in the second display area may include a plurality of second opening portions. Some of edges of one of the plurality of first opening portions arranged in the first display area may be more outwardly arranged in a first direction than some of edges of one of the one or more holes, the one of the one or more holes corresponding to the one of the plurality of first opening portions. Some of edges of another of the plurality of first opening portions arranged in the first display area may be more outwardly arranged in a second direction than some of edges of another of the one or more holes, the other of the one or more holes corresponding to the other of the plurality of first opening portions.

The at least one first opening portion arranged in the first display area may include a plurality of first opening portions. The at least one second opening portion arranged in the second display area may include a plurality of second opening portions. In the plan view, each of the plurality of first opening portions and each of the one or more holes may have a square shape or a diamond shape, and an edge of one of the plurality of first opening portions may be arranged in an edge of a first hole from among the one or more holes, the first hole corresponding to the one of the plurality of first opening portions.

In the plan view, an edge of another of the plurality of first opening portions may be arranged outside an edge of a second hole from among the one or more holes, the second hole corresponding to the other of the plurality of first opening portions.

In the plan view, the plurality of second opening portions may be arranged in the opening area.

BRIEF DESCRIPTION OF THE DRAWINGS

The above and other aspects and features of certain embodiments of the disclosure will be more apparent from the following description taken in conjunction with the accompanying drawings, in which.

DETAILED DESCRIPTION

Figure 1:
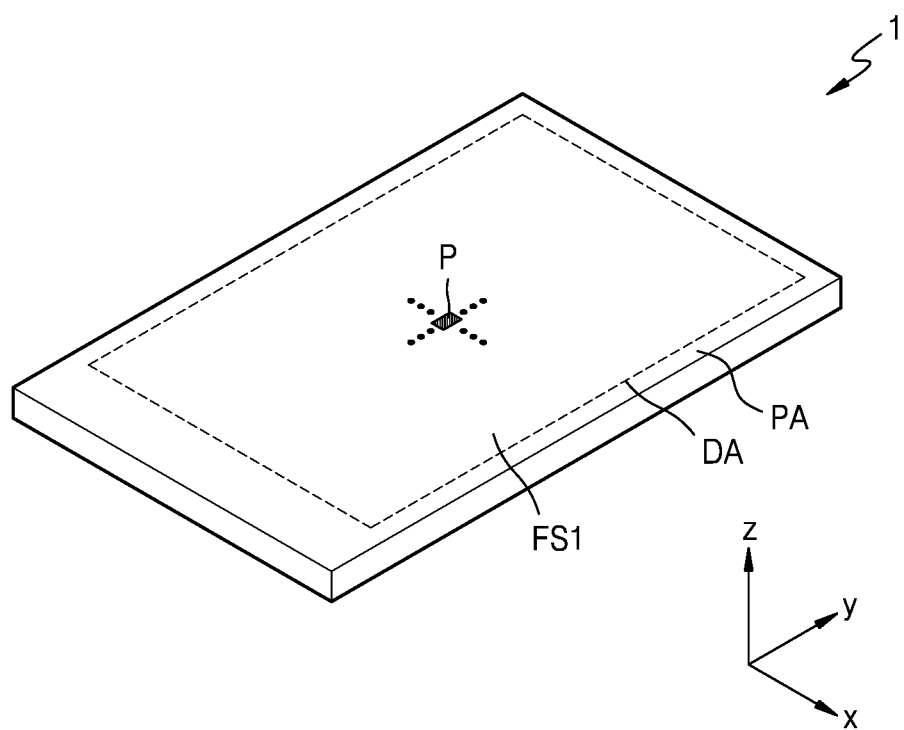
FIG. 1 is a schematic perspective view of a display apparatus according to one or more embodiments.

Reference will now be made in more detail to embodiments, examples of which are illustrated in the accompanying drawings, wherein like reference numerals refer to like elements throughout, and duplicative descriptions thereof may not be provided. In this regard, the present embodiments may have different forms and should not be construed as being limited to the descriptions and terminology set forth herein. Accordingly, the embodiments are merely described below, by referring to the figures, to explain aspects of one or more embodiments of the present disclosure.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

While the disclosure is capable of various modifications and alternative forms, embodiments thereof are shown by way of example in the drawings and will herein be described in more detail. Effects and characteristics of the disclosure, and realizing methods thereof will become apparent by referring to the drawings and embodiments described in more detail below. However, the disclosure is not limited to the embodiments disclosed hereinafter and may be realized in various forms.

Hereinafter, embodiments of the disclosure will be described in more detail by referring to the accompanying drawings. In descriptions with reference to the drawings, the same reference numerals are given to components that are the same or substantially the same and descriptions will not be repeated.

It will be understood that although the terms "first," "second," etc. may be used herein to describe various components, these components should not be limited by these terms. These terms are only used to distinguish one component from another.

Further, the use of "may" when describing embodiments of the present disclosure refers to "one or more embodiments of the present disclosure".

As used herein, the singular expressions "a," "an," and "the" are intended to include the plural forms as well, unless the context clearly indicates otherwise.

It will be further understood that the terms "includes," "including," "comprises," and/or "comprising," when used in this specification, specify the presence of stated features, steps, operations, elements, components, and/or groups thereof, but do not preclude the presence or addition of one or more other features, steps, operations, elements, components, and/or groups thereof.

It will be understood that when an element is referred to as being "on," "connected to," or "coupled to" another element, it may be directly "on," "connected," or "coupled to" the other element or one or more intervening elements may also be present. When an element is referred to as being "directly on," "directly connected to," or "directly coupled to" another element, there are no intervening elements present.

In the drawings, the relative sizes of elements, layers, and regions may be exaggerated and/or simplified for clarity. Spatially relative terms, such as "beneath," "below," "lower," "above," "upper," "bottom," "top," and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative terms used herein should be interpreted accordingly.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

As used herein, the terms "substantially," "approximately," and similar terms are used as terms of approximation and not as terms of degree, and are intended to account for the inherent deviations in measured or calculated values that would be recognized by those of ordinary skill in the art.

When a certain embodiment may be implemented differently, a specific process order may be performed differently from the described order. For example, two consecutively described processes may be performed substantially at the same time or performed in an order opposite to the described order.

Unless otherwise defined, all terms (including technical and scientific terms) used herein have the same meaning as commonly understood by one of ordinary skill in the art to which this disclosure pertains. Terms, such as those defined in commonly used dictionaries, should be interpreted as having a meaning that is consistent with their meaning in the context of the relevant art and should not be interpreted in an idealized or overly formal sense, unless expressly so defined herein.

A display apparatus may be an apparatus for displaying an image. The display apparatus may include portable mobile apparatuses, such as a game console, a multimedia apparatus, and a subminiature personal computer (PC). Display apparatuses to be described below may include a liquid crystal display apparatus, an electrophoretic display apparatus, an organic light-emitting display apparatus, an inorganic light-emitting display apparatus, a field emission display apparatus, a surface-conduction electron-emitter display apparatus, a quantum dot display apparatus, a plasma display apparatus, a cathode ray display apparatus, etc. Hereinafter, organic light-emitting display apparatuses are described as examples of the display apparatuses according to one or more embodiments. However, display apparatuses according to one or more embodiments of the present disclosure may include various suitable types of display apparatuses as described above.

FIG. 1 is a schematic perspective view of a display apparatus according to one or more embodiments.

Referring to FIG. 1, the display apparatus 1 may include a display area DA and a peripheral area PA. A sub-pixel P may be arranged in the display area DA. According to one or more embodiments, the sub-pixel P may be arranged on a front surface FS1 of the display apparatus 1.

According to one or more embodiments, a plurality of sub-pixels P may be arranged in the display area DA. The sub-pixel P may be realized via a display element. The display apparatus 1 may provide an image by using light emitted from the sub-pixel P. According to one or more embodiments, the light emitted from the sub-pixel P may proceed in a direction perpendicular to the front surface FS1 of the display apparatus 1 (e.g., a z direction) and/or a direction substantially perpendicular to the front surface FS1 of the display apparatus 1. According to one or more embodiments, the light emitted from the sub-pixel P may proceed in a direction oblique to the front surface FS1 of the display apparatus 1 (e.g., a direction crossing the z direction).

According to one or more embodiments, the sub-pixel P may emit red, green, or blue light by using the display element. According to one or more embodiments, the sub-pixel P may emit red, green, blue, or white light by using the display element. According to one or more embodiments, the sub-pixel P may be defined as an emission area of the display element emitting any one of red, green, blue, and white light. Here, the sub-pixel P may be provided in a multiple number (i.e., a plurality of sub-pixels P may be provided), and the plurality of sub-pixels P may be arranged to be spaced from or apart from each other. Also, some of the plurality of sub-pixels P, others of the plurality of sub-pixels P, and yet others of the plurality of sub-pixels P may emit light of different colors from one another.

The sub-pixel P may include a light-emitting diode as the display element for emitting light of a color (e.g., a predetermined color). The light-emitting diode may include, as an emission layer, an organic light-emitting diode including an organic material. Alternatively, the light-emitting diode may include an inorganic light-emitting diode. Alternatively, the light-emitting diode may include quantum dots as an emission layer. According to one or more embodiments, a size of the light-emitting diode may be a micro-scale or a nano-scale. For example, the light-emitting diode may include a micro-light-emitting diode. Alternatively, the light-emitting diode may include a nano-light-emitting diode. The nano-light-emitting diode may include GaN. According to one or more embodiments, a color conversion layer may be arranged on the nano-light-emitting diode. The color conversion layer may include quantum dots. Hereinafter, for convenience of explanation, a case in which the light-emitting diode includes an organic light-emitting diode is primarily described in more detail.

The peripheral area PA may be an area not providing an image. The peripheral area PA may be around (e.g., at least partially surround) the display area DA. According to one or more embodiments, the peripheral area PA may entirely surround the display area DA. A driver, etc. configured to provide electrical signals or power to the sub-pixel P may be arranged in the peripheral area PA. Also, the peripheral area PA may include a pad area in which a pad is arranged.

Figure 2A:
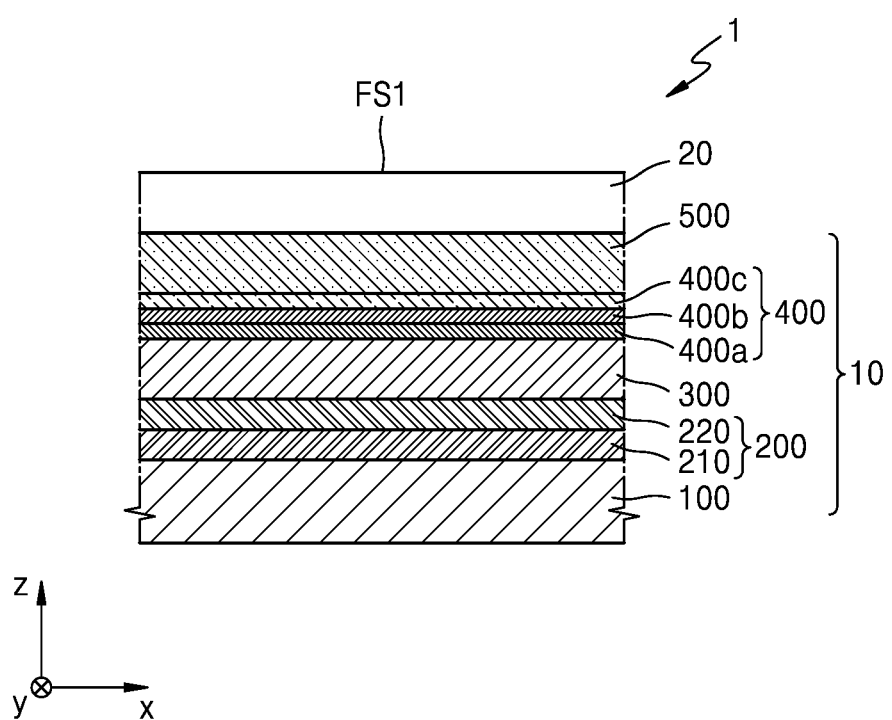
FIGS. 2A and 2B are schematic cross-sectional views of a display apparatus according to one or more embodiments.
Figure 2B:
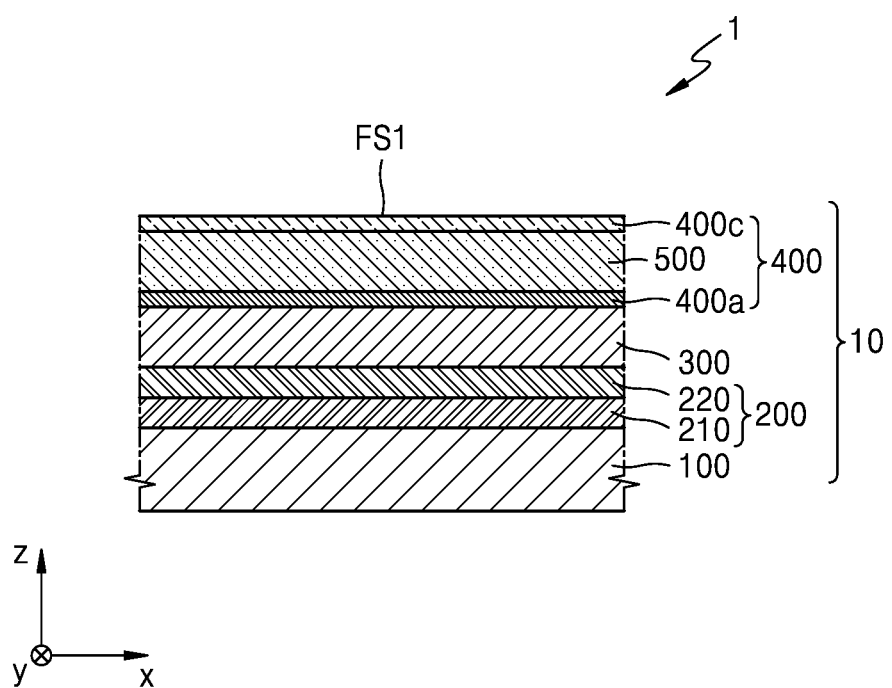

FIGS. 2A and 2B are schematic cross-sectional views of the display apparatus according to one or more embodiments.

Referring to FIGS. 2A and 2B, the display apparatus 1 may include a display panel 10 and a cover window 20. The display panel 10 may include a substrate 100, a display layer 200, an encapsulation layer 300, a functional layer 400, and a reflection prevention layer 500.

The substrate 100 may include glass or polymer resins such as polyethersulfone, polyarylate, polyetherimide, polyethylene naphthalate, polyethylene terephthalate, polyphenylene sulfide, polyimide, polycarbonate, cellulose tri acetate, or cellulose acetate propionate. According to one or more embodiments, the substrate 100 may have a multilayer structure including a base layer and a barrier layer, the base layer including the polymer resins described above. The substrate 100 including the polymer resins may be flexible, rollable, or bendable.

The display layer 200 may be arranged on the substrate 100. The display layer 200 may include a pixel circuit layer 210 and a display element layer 220. The pixel circuit layer 210 may include pixel circuits. The display element layer 220 may include a plurality of display elements connected to the plurality of pixel circuits, respectively. Each of the display elements included in the display element layer 220 may define a pixel. The pixel circuit layer 210 may include a plurality of thin-film transistors and a plurality of storage capacitors.

The encapsulation layer 300 may be arranged on the display layer 200. According to one or more embodiments, the encapsulation layer 300 may include at least one inorganic encapsulation layer and at least one organic encapsulation layer. The at least one inorganic encapsulation layer may include one or more inorganic materials from among $Al_2O_3$, $TiO_2$, $Ta_2O_5$, $ZnO_x$ (including ZnO and $ZnO_2$), $SiO_2$, $SiN_x$, and SiON. The at least one organic encapsulation layer may include a polymer-based material. The polymer-based material may include acryl-based resins, epoxy-based resins, polyimide, polyethylene, etc. According to one or more embodiments, the at least one organic encapsulation layer may include acrylate.

According to one or more embodiments, the encapsulation layer 300 may have a structure in which the substrate 100 and an upper substrate, which is a transparent member, may be coupled via a sealing member so that an inner space between the substrate 100 and the upper substrate is sealed. Here, an absorbent, desiccant, or a filler may be disposed in the inner space. The sealing member may include a sealant, and according to one or more embodiments, the sealing member may include a material hardened by a laser beam. For example, the sealing member may include frit. In more detail, the sealing member may include urethane-based resins, epoxy-based resins, or acryl-based resins, which are organic sealants, or silicone, which is an inorganic sealant. The urethane-based resins may include, for example, urethane acrylate, etc. The acryl-based resins may include, for example, butyl acrylate, ethyl hexyl acrylate, etc. The sealing member may include a material hardened by heat.

The functional layer 400 may be arranged on the encapsulation layer 300. The functional layer 400 may include a first layer 400a, a second layer 400b, and a third layer 400c. According to one or more embodiments, the first layer 400a may include a touch sensor layer. The touch sensor layer may be configured to sense a touch input of a user and may be configured to sense the touch input of the user by using at least one of various suitable touch methods, such as a resistive layer method, a capacitance method, etc.

The second layer 400b may include a light blocking layer. Here, the light blocking layer may at least partially absorb external light or internal reflection light. The light blocking layer may include black pigments. The light blocking layer may include a black matrix. The light blocking layer may be arranged on the display area DA. The light blocking layer may include an opening portion so that light emitted from a pixel arranged in the display area DA may be transmitted to the outside. For example, the opening portion of the light blocking layer may overlap the pixel arranged in the display area DA in a thickness direction of the substrate 100.

The third layer 400c may include an optical layer. According to one or more embodiments, the optical layer may include a planarization layer. For example, the planarization layer may include a light blocking layer and an organic material. The organic material may be arranged in an opening portion of the light blocking layer and transmit light. The optical layer may include a refractive layer having a structure configured to adjust a direction of light emitted from display elements. The refractive layer may include multiple layers. When the refractive layer includes multiple layers, the refractive layer may include a first refractive layer including a light transmissive inorganic or organic material having low refractivity and a second refractive layer arranged on the first refractive layer and including a light transmissive inorganic or organic material having high refractivity. In this case, the first refractive layer may be arranged on the light blocking layer and may form a pattern (e.g., a predetermined pattern). Here, according to one or more embodiments of the present disclosure, the third layer 400c may be omitted. For example, the third layer 400c may not be arranged on the second layer 400b, and the reflection prevention layer 500 may be arranged on the second layer 400b. In this case, the reflection prevention layer 500 may include a film-type reflection prevention layer, and after an adhesive is disposed on the second layer 400b, the reflection prevention layer 500 may be disposed on the adhesive layer to be fixed to the second layer 400b.

The reflection prevention layer 500 may be arranged above the functional layer 400. The reflection prevention layer 500 may reduce the reflectivity of light (e.g., external light) incident toward the display panel 10 from the outside.

According to one or more embodiments, the reflection prevention layer 500 may include a polarization film. The polarization film may include a linear polarization plate and a phase delay film such as a quarter-wave (N/4) plate. The phase delay film may be arranged on the functional layer 400, and the linear polarization plate may be arranged on the phase delay film.

According to one or more embodiments, the reflection prevention layer 500 may include a filter layer including a light blocking layer.

According to one or more embodiments, when the reflection prevention layer 500 includes a light blocking layer, the reflection prevention layer 500 may be arranged between the first layer 400a and the third layer 400c, as illustrated in FIG.

2B. In this case, the reflection prevention layer 500 may include a color filter layer and the light blocking layer. Here, as described above, the light blocking layer may include an opening portion through which light emitted from a pixel may be transmitted, and the color filter layer may be arranged in the opening portion of the light blocking layer. In this case, the third layer 400c may be omitted in one or more embodiments.

The cover window 20 may be arranged on the display panel 10. According to one or more embodiments, the cover window 20 may be coupled to components therebelow, for example, at least one of the reflection prevention layer 500 or the functional layer 400, through adhesion via an optically clear adhesive (OCA). The cover window 20 may protect the display panel 10. The cover window 20 may include at least one of glass, sapphire, or plastic. The cover window 20 may include, for example, ultra-thin glass (UTG) or colorless polyimide (CPI).

Figure 3:
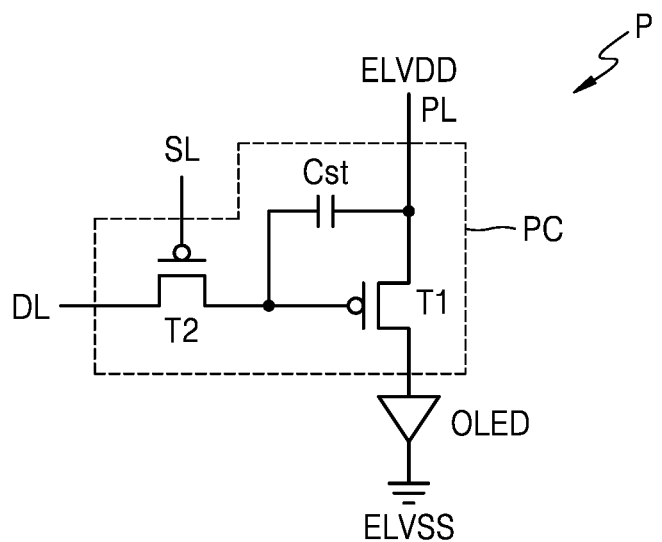
FIG. 3 is a schematic equivalent circuit diagram of a sub-pixel according to one or more embodiments.

FIG. 3 is a schematic equivalent circuit diagram of a sub-pixel according to one or more embodiments.

Referring to FIG. 3, the sub-pixel P may include a pixel circuit PC, and may include an organic light-emitting diode OLED as a display element.

The pixel circuit PC may include a driving thin-film transistor T1, a switching thin-film transistor T2, and a storage capacitor Cst. Each sub-pixel P may emit, for example, red, green, or blue light or red, green, blue, or white light through the organic light-emitting diode OLED.

The switching thin-film transistor T2 may be connected to a scan line SL and a data line DL and may be configured to transmit a data signal or a data voltage input through the data line DL, to the driving thin-film transistor T1, in response to a scan signal or a switching voltage input through the scan line SL. The storage capacitor Cst may be connected to the switching thin-film transistor T2 and a driving voltage line PL and may be configured to store a voltage corresponding to a difference between a voltage received from the switching thin-film transistor T2 and a first power voltage ELVDD supplied to the driving voltage line PL.

The driving thin-film transistor T1 may be connected to the driving voltage line PL and the storage capacitor Cst and may be configured to control a driving current flowing from the driving voltage line PL through the organic light-emitting diode OLED according to a value of the voltage stored in the storage capacitor Cst. The organic light-emitting diode OLED may emit light having a certain brightness according to the driving current. A common electrode (e.g., a cathode) of the organic light-emitting diode OLED may receive a second power voltage ELVSS.

Figure 4:
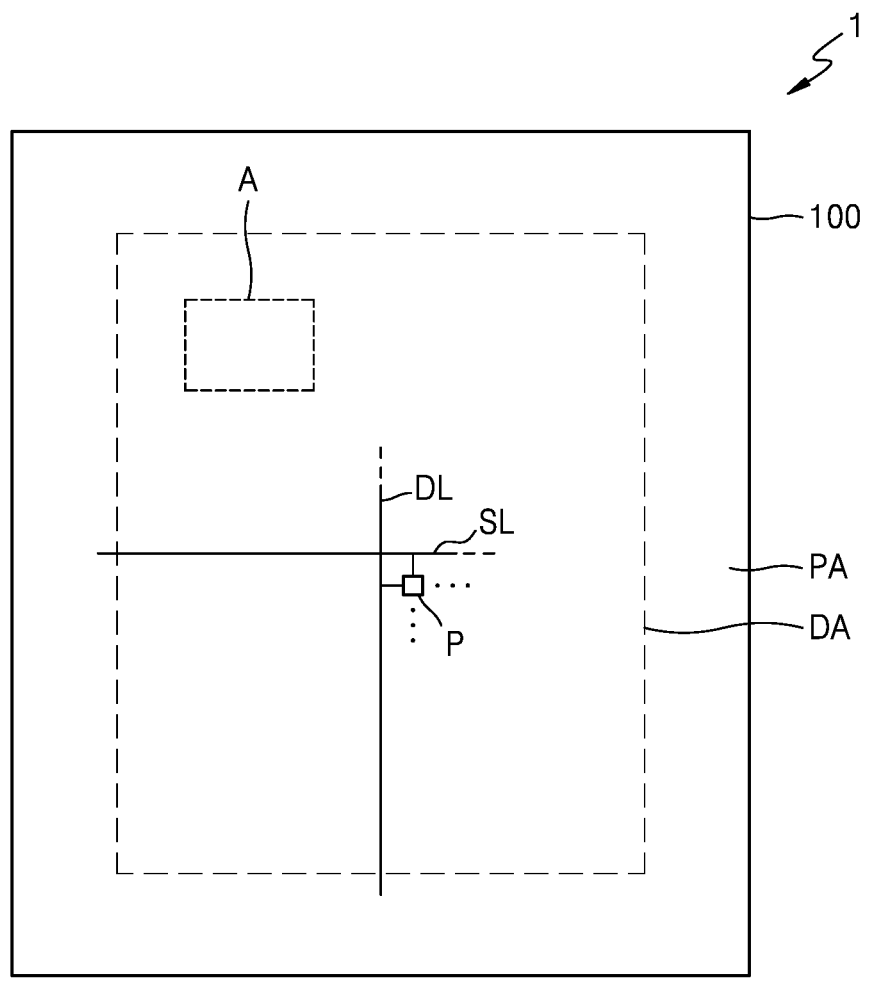
FIG. 4 is a schematic plan view of a display apparatus according to one or more embodiments.
Figure 4:
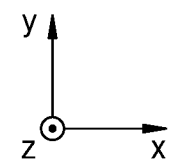

FIG. 4 is a schematic plan view of the display apparatus according to one or more embodiments.

Referring to FIG. 4, the display apparatus 1 may include the substrate 100 and a multi-layer on the substrate 100. The display area DA and the peripheral area PA may be defined on the substrate 100 and/or the multi-layer. For example, the substrate 100 may include the display area DA and the peripheral area PA. Hereinafter, a case in which the display area DA and the peripheral area PA are defined on the substrate 100 is primarily described in more detail.

The sub-pixels P may be arranged in the display area DA, and the sub-pixels P may display an image. Each sub-pixel P may be connected to a scan line SL extending in a first direction (e.g., an x direction or a −x direction) and a data line DL extending in a second direction (e.g., a y direction or a −y direction).

The peripheral area PA may be arranged outside the display area DA. The peripheral area PA may be around (e.g., at least partially surround) the display area DA. According to one or more embodiments, the peripheral area PA may entirely surround the display area DA. A scan driver configured to provide a scan signal to each sub-pixel P may be arranged on the peripheral area PA. A data driver configured to provide a data signal to the sub-pixel P may arranged on the peripheral area PA. The peripheral area PA may include a pad area. According to one or more embodiments, a pad may be arranged on the pad area. The pad may be exposed by not being covered by an insulating layer and may be connected (e.g., electrically connected) to a printed circuit board or a driver integrated circuit (IC). Signals and/or voltages transmitted from the printed circuit board or the driver IC through the pad may be transmitted to the sub-pixels P arranged on the display area DA through a line connected to the pad.

Figure 5A:
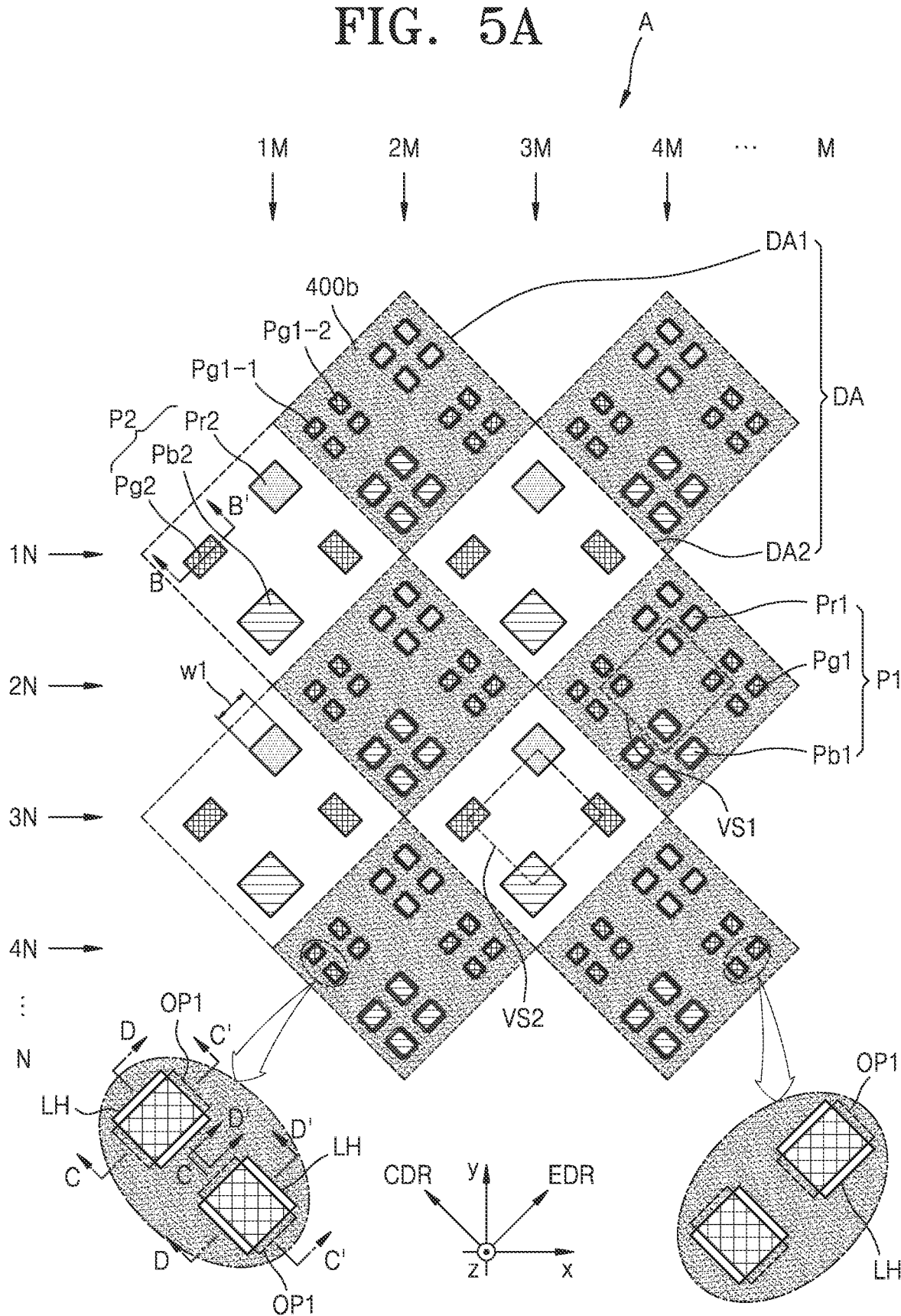
FIG. 5A is an enlarged view of a display area of a display apparatus according to one or more embodiments.

FIG. 5A is an enlarged view of a display area of the display apparatus according to one or more embodiments. FIG. 5A is an enlarged view of portion A of a display area of the display apparatus according to one or more embodiments.

Referring to FIG. 5A, the display area DA may include a first display area DA1 and a second display area DA2. Here, the first display area DA1 and the second display area DA2 may operate in various suitable manners. For example, both of the first display area DA1 and the second display area DA2 may operate to realize (or to display) an image in a first mode. That is, in the first mode, both of a first sub-pixel P1 arranged on the first display area DA1 and a second sub-pixel P2 arranged on the second display area DA2 may operate (e.g., emit light). However, in a second mode, only the first display area DA1 may operate to realize (or to display) an image. In this case, the first sub-pixel P1 arranged on the first display area DA1 may operate (e.g., emit light), and the second sub-pixel P2 arranged on the second display area DA2 may not operate (e.g., not emit light). In this case, while only the first display area DA1 may operate (e.g., emit light), the first display area DA1 may be adjusted such that others may not be able to see an image of the display apparatus 1 through a planar shape of a first opening portion OP1 of a pixel-defining layer 225 (see FIG. 5B) and a planar shape of a hole LH of the second layer 400b, which is a light blocking layer. Although P1 refers to a first sub-pixel and P2 refers to a second sub-pixel, in one or more embodiments, P1 may refer to a second pixel and P2 may refer to a first pixel.

According to one or more embodiments, each of the first display area DA1 and the second display area DA2 may be provided in a multiple number. In other words, a display apparatus 1 may include a plurality of first display areas DA1 and a plurality of second display areas DA2. According to one or more embodiments, the plurality of first display areas DA1 and the plurality of second display areas DA2 may be arranged in or along a first direction and a second direction crossing the first direction. According to one or more embodiments, the first direction and the second direction may intersect each other at a right angle. For example, the first direction may be an x direction or a −x direction. The second direction may be a y direction or a −y direction. According to one or more embodiments, the first direction and the second direction may intersect each other at an acute or obtuse angle. Hereinafter, a case in which the first direction (e.g., the x direction or the −x direction) and the second direction (e.g., the y direction or the −y direction) are orthogonal to each other is primarily described in more detail.

The plurality of second display areas DA2 may be arranged in the first direction (e.g., the x direction or the −x direction) in a first row 1N. The plurality of first display areas DA1 may be arranged in the first direction (e.g., the x direction or the −x direction) in a second row 2N adjacent to the first row 1N. The plurality of second display areas DA2 may be arranged in the first direction (e.g., the x direction or the −x direction) in a third row 3N adjacent to the second row 2N. The plurality of first display areas DA1 may be arranged in the first direction (e.g., the x direction or the −x direction) in a fourth row 4N adjacent to the third row 3N.

The plurality of second display areas DA2 arranged in the first row 1N may be misaligned with the plurality of first display areas DA1 arranged in the second row 2N. Thus, the plurality of second display areas DA2 may be arranged in the second direction (e.g., the y direction or the −y direction) in a first column 1M. The plurality of first display areas DA1 may be arranged in the second direction (e.g., the y direction or the −y direction) in a second column 2M adjacent to the first column 1M. The plurality of second display areas DA2 may be arranged in the second direction (e.g., the y direction or the −y direction) in a third column 3M adjacent to the second column 2M. The plurality of first display areas DA1 may be arranged in the second direction (e.g., the y direction or the −y direction) in a fourth column 4M adjacent to the third column 3M.

The plurality of second display areas DA2 may be alternately arranged with the plurality of first display areas DA1 in or along an extension direction EDR crossing the first direction (e.g., the x direction or the −x direction) and the second direction (e.g., the y direction or the −y direction). The plurality of second display areas DA2 may be alternately arranged with the plurality of first display areas DA1 in or along a crossing direction CDR crossing the extension direction EDR. According to one or more embodiments, the extension direction EDR and the crossing direction CDR may intersect each other at a right angle. According to one or more embodiments, the extension direction EDR and the crossing direction CDR may be at an acute angle or an obtuse angle with each other. Hereinafter, a case in which the extension direction EDR and the crossing direction CDR are orthogonal to each other is primarily described in more detail.

To express this arrangement structure of the display area DA in a different way, any one of the plurality of first display areas DA1 may be surrounded by the plurality of second display areas DA2. For example, any one of the plurality of first display areas DA1 may be surrounded by four of the plurality of second display areas DA2. Any one of the plurality of second display areas DA2 may be surrounded by the plurality of first display areas DA1. For example, any one of the plurality of second display areas DA2 may be surrounded by four of the plurality of first display areas DA1.

The first sub-pixel P1 may be arranged on the first display area DA1. A planar shape of the first sub-pixel P1 may be an area for emitting light to the outside. Also, the planar shape of the first sub-pixel P1 may be defined by a planar shape of the first opening portion OP1 of the pixel-defining layer 225 (see FIG. 5B) and a planar shape of the hole LH of the second layer 400b, which is the light blocking layer. That is, when the planar shape of the first opening portion OP1 of the pixel-defining layer 225 and the planar shape of the hole LH of the second layer 400b, which is the light blocking layer, overlap each other, the planar shape of the first sub-pixel P1 may be defined as an area in which the planar shape of the first opening portion OP1 of the pixel-defining layer 225 and the planar shape of the hole LH of the second layer 400b, which is the light blocking layer, overlap each other. Here, the planar shape of the first opening portion OP1 of the pixel-defining layer 225 may be a planar shape of a first pixel area, and the planar shape of the hole LH of the second layer 400b, which is the light blocking layer, may be a planar shape of a first transmission area.

In this case, the planar shape of the first pixel area may be arranged on the second display area DA2 and may be less in area (e.g., planar area) than a planar shape of a second pixel area emitting the same color as the first pixel area. For example, the planar shape of the second pixel area arranged in a second green sub-pixel Pg2 illustrated in FIG. 5A may be different in area (e.g., planar area) from the planar shape of the first pixel area arranged in one of a 1-1st green sub-pixel Pg1-1 and a 1-2nd green sub-pixel Pg1-2. For example, the planar shape of the second pixel area arranged in the second green sub-pixel Pg2 may be greater in area (e.g., planar area) than the planar shape of the first pixel area arranged in one of the 1-1st green sub-pixel Pg1-1 and the 1-2nd green sub-pixel Pg1-2. Here, the planar shape of the first pixel area may be the same as the planar shape of the first sub-pixel P1, and the planar shape of the second pixel area may be the same as a planar shape of the second sub-pixel P2, as illustrated in FIG. 5A. However, the present disclosure is not limited thereto.

The first sub-pixel P1 may overlap the first display area DA1. According to one or more embodiments, the first sub-pixel P1 may include a first red sub-pixel Pr1, a first green sub-pixel Pg1, and a first blue sub-pixel Pb1. According to one or more embodiments, the first sub-pixel P1 may include a first red sub-pixel Pr1, a first green sub-pixel Pg1, a first blue sub-pixel Pb1, and a first white sub-pixel. Hereinafter, a case in which the first sub-pixel P1 includes the first red sub-pixel Pr1, the first green sub-pixel Pg1, and the first blue sub-pixel Pb1 is primarily described in more detail.

According to one or more embodiments, each of the first red sub-pixel Pr1, the first green sub-pixel Pg1, and the first blue sub-pixel Pb1 may be provided in a multiple number in the first display area DA1. In other words, a plurality of first red sub-pixels Pr1, a plurality of the first green sub-pixels Pg1, and a plurality of first blue sub-pixels Pb1 may be in the first display area DA1. For example, four first red sub-pixels Pr1 may be arranged in one first display area DA1. Eight first green sub-pixels Pg1 may be arranged in one first display area DA1. Four first blue sub-pixels Pb1 may be arranged in one first display area DA1.

According to one or more embodiments, a virtual first square VS1 may be defined in the first display area DA1. The virtual first square VS1 may have a first vertex, a second vertex, a third vertex, and a fourth vertex. According to one or more embodiments, the plurality of first red sub-pixels Pr1 may be symmetrically arranged (e.g., arranged in rotational symmetry) with respect to the first vertex. The four first red sub-pixels Pr1 may be symmetrically arranged (e.g., arranged in rotational symmetry) with respect to the first vertex. The plurality of first blue sub-pixels Pb1 may be symmetrically arranged (e.g., arranged in rotational symmetry) with respect to the third vertex facing the first vertex. For example, the plurality of first blue sub-pixels Pb1 may be symmetrically arranged (e.g., arranged in rotational symmetry) with respect to the third vertex. The plurality of first green sub-pixels Pg1 may be symmetrically arranged (e.g., arranged in rotational symmetry) with respect to the second vertex and the fourth vertex facing each other. For example, four first green sub-pixels Pg1 may be symmetrically arranged (e.g., arranged in rotational symmetry) with respect to the second vertex. Four first green sub-pixels Pg1 may be symmetrically arranged (e.g., arranged in rotational symmetry) with respect to the fourth vertex.

In this case, the sum of areas (e.g., planar areas) of the first sub-pixel P1 arranged in a unit first display area DA1 may be greater than the sum of areas (e.g., planar areas) of the second sub-pixel P2 arranged in the second display area DA2, wherein the first sub-pixel P1 and the second sub-pixel P2 emit the same color of light as each other. For example, the sum of areas (e.g., planar areas) of the first green sub-pixels Pg1 arranged in the unit first display area DA1 may be greater than the sum of areas (e.g., planar areas) of the second green sub-pixels Pg2 arranged in the second display area DA2. That is, the sum of areas (e.g., planar areas) of the eight first green sub-pixels Pg1 arranged in the unit first display area DA1 may be greater than the sum of areas (e.g., planar areas) of two second green sub-pixels Pg2 arranged in the second display area DA2. Also, the sum of areas (e.g., planar areas) of the four first red sub-pixels Pr1 arranged in the unit first display area DA1 may be greater than the entire area (e.g., entire planar area) of one second red sub-pixel Pr2 arranged in the second display area DA2. The sum of areas (e.g., planar areas) of the four first blue sub-pixels Pb1 arranged in the unit first display area DA1 may be greater than the entire area (e.g., entire planar area) of one second blue sub-pixel Pb2 arranged in the second display area DA2.

At least one of the first green sub-pixel Pg1, the first red sub-pixel Pr1, or the first blue sub-pixel Pb1 described above may have a rectangular shape, a diamond shape, or a square shape. Here, the at least one of the first green sub-pixel Pg1, the first red sub-pixel Pr1, or the first blue sub-pixel Pb1 may be tilted with respect to the first direction (e.g., the x direction or the −x direction). That is, one of edges of the at least one of the first green sub-pixel Pg1, the first red sub-pixel Pr1, or the first blue sub-pixel Pb1 may cross or be inclined with respect to the first direction. The at least one of the first green sub-pixel Pg1, the first red sub-pixel Pr1, or the first blue sub-pixel Pb1 may be tilted with respect to the second direction (e.g., the y direction or the −y direction). For example, a side of the at least one of the first green sub-pixel Pg1, the first red sub-pixel Pr1, or the first blue sub-pixel Pb1 may be formed to be sloped with respect to a y direction of FIG. 5A. According to one or more embodiments, a side of the first sub-pixel P1 may be arranged in the extension direction EDR or the crossing direction CDR of FIG. 5A. Hereinafter, for convenience of explanation, a case in which all of the first green sub-pixel Pg1, the first red sub-pixel Pr1, and the first blue sub-pixel Pb1 have rectangular shapes is primarily described in more detail.

The first green sub-pixel Pg1 may have a rectangular shape having long sides and short sides. The first green sub-pixel Pg1 may be defined as an emission area (or a pixel area) emitting green light in the first display area DA1. The first green sub-pixel Pg1 may be provided in a multiple number in the first display area DA1. In other words, a plurality of first green sub-pixels Pg1 may be in the first display area DA1. Some of the plurality of first green sub-pixels Pg1 arranged in the same first display area DA1 and the others of the plurality of first green sub-pixels Pg1 may be arranged in different directions from each other. For example, the plurality of first green sub-pixels Pg1 arranged in the first display area DA1 may include 1-1st green sub-pixels Pg1-1 tilted with respect to the first direction and 1-2nd green sub-pixels Pg1-2 tilted with respect to the first direction and arranged in a different direction from the 1-1st green sub-pixels Pg1-1. In this case, short sides of the 1-1st green sub-pixels Pg1-1 may face the first red sub-pixel Pr1. Long sides of the 1-1st green sub-pixels Pg1-1 may face the first blue sub-pixel Pb1. According to one or more embodiments, the long sides of the 1-1st green sub-pixels Pg1-1 may extend in the extension direction EDR. The short sides of the 1-1st green sub-pixels Pg1-1 may extend in the crossing direction CDR. Short sides of the 1-2nd green sub-pixels Pg1-2 may face the first blue sub-pixel Pb1, and long sides of the 1-2nd green sub-pixels Pg1-2 may face the first red sub-pixel Pr1. Here, the short sides of the 1-2nd green sub-pixels Pg1-2 may extend in the extension direction EDR. The long sides of the 1-2nd green sub-pixels Pg1-2 may extend in the crossing direction CDR.

A planar shape of the first green sub-pixel Pg1 may be defined by the planar shape of the first opening portion OP1 of the pixel-defining layer 225 (see FIG. 5B) and the planar shape of the hole LH of the second layer 400b, which is the light blocking layer, as described above. Here, the planar shape of the first opening portion OP1 of the pixel-defining layer 225 and the planar shape of the hole LH of the second layer 400b, which is the light blocking layer, may be different from each other. For example, one of the planar shape of the first opening portion OP1 and the planar shape of the hole LH of the second layer 400b, which is the light blocking layer, may be rectangular, and the other of the planar shape of the first opening portion OP1 and the planar shape of the hole LH of the second layer 400b, which is the light blocking layer, may be square or diamond. Hereinafter, for convenience of explanation, a case in which the planar shape of the first opening portion OP1 is rectangular, and the planar shape of the hole LH of the second layer 400b, which is the light blocking layer, is diamond is primarily described in more detail.

With respect to the first green sub-pixel Pg1, the planar shape of the first opening portion OP1 may be arranged in the planar shape of the hole LH of the second layer 400b, which is the light blocking layer. In this case, a long side of the planar shape of the first opening portion OP1 may be greater than a side of the planar shape of the hole LH of the second layer 400b, which is the light blocking layer, and a short side of the planar shape of the first opening portion OP1 may be less than the other side of the planar shape of the hole LH of the second layer 400b, which is the light blocking layer. Here, when the planar shape of the first opening portion OP1 and the planar shape of the hole LH of the second layer 400b, which is the light blocking layer, overlap each other, a portion of the planar shape of the first opening portion OP1 may outwardly protrude from an edge of the planar shape of the hole LH of the second layer 400b, which is the light blocking layer. That is, the short side of the planar shape of the first opening portion OP1 may be arranged outside (e.g., outside in a plan view) the planar shape of the hole LH of the second layer 400b, which is the light blocking layer. Also, the long side of the planar shape of the first opening portion OP1 may be arranged inside (e.g., inside in a plan view) the planar shape of the hole LH of the second layer 400b, which is the light blocking layer. That is, the long side of the planar shape of the first opening portion OP1 may be arranged to be spaced from or apart from a side of the planar shape of the hole LH of the second layer 400b, which is the light blocking layer, in an inner direction of the hole LH of the second layer 400b, which is the light blocking layer.

At least one of the first red sub-pixel Pr1 or the first blue sub-pixel Pb1 may have a rectangular shape. According to one or more embodiments, a side of the first red sub-pixel Pr1 may extend in the extension direction EDR or the crossing direction CDR. According to one or more embodiments, a side of the first blue sub-pixel Pb1 may extend in the extension direction EDR or the crossing direction CDR.

The second sub-pixel P2 may be arranged on the second display area DA2. The second sub-pixel P2 may overlap the second display area DA2. According to one or more embodiments, the second sub-pixel P2 may include a second red sub-pixel Pr2, a second green sub-pixel Pg2, and a second blue sub-pixel Pb2. According to one or more embodiments, the second sub-pixel P2 may include a second red sub-pixel Pr2, a second green sub-pixel Pg2, a second blue sub-pixel Pb2, and a second white sub-pixel. Hereinafter, a case in which the second sub-pixel P2 includes the second red sub-pixel Pr2, the second green sub-pixel Pg2, and the second blue sub-pixel Pb2 is primarily described in more detail.

According to one or more embodiments, each of the second red sub-pixel Pr2, the second green sub-pixel Pg2, and the second blue sub-pixel Pb2 may be arranged at a vertex of a virtual second square VS2. For example, the second red sub-pixel Pr2 and the second blue sub-pixel Pb2 may be arranged at a first vertex and a third vertex facing each other, and the second green sub-pixels Pg2 may be arranged at the remaining vertexes (i.e., a second vertex and a fourth vertex).

According to one or more embodiments, the second green sub-pixel Pg2 may have a rectangular shape having a long side and a short side. The second green sub-pixel Pg2 may be defined as an emission area emitting green light in the second display area DA2. Short sides of the second green sub-pixels Pg2 may face the second red sub-pixel Pr2. Long sides of the second green sub-pixels Pg2 may face the second blue sub-pixel Pb2. According to one or more embodiments, the long sides of the second green sub-pixels Pg2 may extend in the extension direction EDR. The short sides of the second green sub-pixels Pg2 may extend in the crossing direction CDR.

According to one or more embodiments, at least one of the second red sub-pixel Pr2 or the second blue sub-pixel Pb2 may have a square shape or a diamond shape. The second red sub-pixel Pr2 may be defined as an emission area emitting red light in the second display area DA2. The second blue sub-pixel Pb2 may be defined as an emission area emitting blue light in the second display area DA2. According to one or more embodiments, at least one of the second red sub-pixel Pr2 or the second blue sub-pixel Pb2 may have a rectangular shape. According to one or more embodiments, a side of the second red sub-pixel Pr2 may extend in the extension direction EDR or the crossing direction CDR. According to one or more embodiments, a side of the second blue sub-pixel Pb2 may extend in the extension direction EDR or the crossing direction CDR.

A size of the second sub-pixel P2 may be greater than a size of the first sub-pixel P1. The size of the second sub-pixel P2 may be defined by an area (e.g., a planar area) of the second sub-pixel P2. The size of the first sub-pixel P1 may be defined by an area (e.g., a planar area) of the first sub-pixel P1. For example, a size of the second red sub-pixel Pr2 may be greater than a size of the first red sub-pixel Pr1. A size of the second green sub-pixel Pg2 may be greater than a size of the first green sub-pixel Pg1. A size of the second blue sub-pixel Pb2 may be greater than a size of the first blue sub-pixel Pb1.

The second layer 400b, which is the light blocking layer, may at least partially absorb external light or internal reflection light. The second layer 400b, which is the light blocking layer, may include black pigments. The second layer 400b, which is the light blocking layer, may include a black matrix. The second layer 400b, which is the light blocking layer, may be arranged on the display area DA. The second layer 400b, which is the light blocking layer, may be arranged on the first display area DA1. The second layer 400b, which is the light blocking layer, may overlap the first display area DA1.

The second layer 400b, which is the light blocking layer, may include the hole LH. The hole LH may penetrate the second layer 400b, which is the light blocking layer.

The hole LH may overlap the first display area DA1. The hole LH may be provided in a multiple number. In other words, a plurality of holes LH may be provided. Here, the holes LH may respectively overlap the plurality of first sub-pixels P1 arranged on the first display area DA1.

The size of the first sub-pixel P1 may be less than a size of the hole LH. According to one or more embodiments, the first sub-pixel P1 may be arranged in the hole LH. For example, the first green sub-pixel Pg1 may be arranged in the hole LH. In this case, the size of the hole LH may be greater or less than an emission area emitting green light. For example, with respect to some of the plurality of first sub-pixels P1, the size of the hole LH may be greater than the emission area emitting green light, in the crossing direction CDR, and the size of the hole LH may be less than the emission area emitting green light, in the extension direction EDR. That is, a first pixel area corresponding to some of the plurality of first sub-pixels P1 may be greater than a first transmission area in the crossing direction CDR, and the first pixel area corresponding to some of the plurality of first sub-pixels P1 may be less than the first transmission area in the extension direction EDR. With respect to the others of the plurality of first sub-pixels P1, the size of the hole LH arranged in the others of the plurality of first sub-pixels P1 may be greater than the emission area emitting green light, in the extension direction EDR, and the size of the hole LH arranged in the others of the plurality of first sub-pixels P1 may be less than the emission area emitting green light, in the crossing direction CDR. That is, the first pixel area corresponding to the others of the plurality of first sub-pixels P1 may be greater than the first transmission area in the extension direction EDR, and the first pixel area corresponding to the others of the plurality of first sub-pixels P1 may be less than the first transmission area in the crossing direction CDR.

In this case, light emitted from the first sub-pixels P1 may be emitted in a third direction (e.g., a z direction or a −z direction) perpendicular to the first direction (e.g., the x direction or the −x direction) and the second direction (e.g., the y direction or the −y direction). Thus, an image may be recognized based on the third direction (e.g., the z direction or the −z direction). Also, by blocking laterally proceeding light by using the second layer 400b, which is the light blocking layer, the light may reach a user of the display apparatus 1, but may not reach others around the user. That is, the display apparatus 1 may provide a narrow viewing angle in the first display area DA1.

Also, with respect to the first sub-pixel P1 described above, there may be a desired level (e.g., a predetermined level) of positional error between an emission area and the hole LH, and thus, the first sub-pixel P1 may be manufactured to be arranged in the hole LH.

Figure 5B:
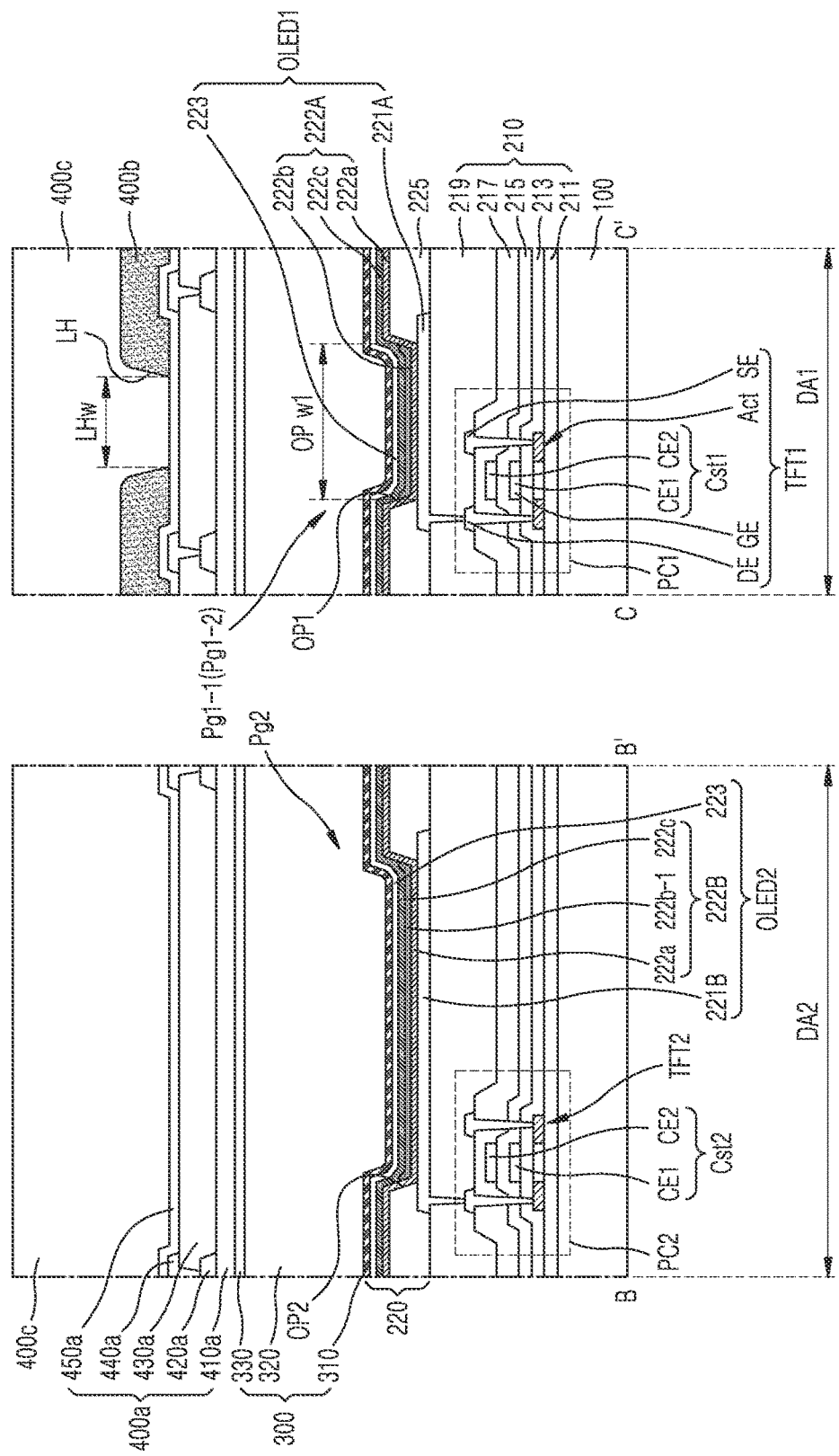
FIGS. 5B and 5C are cross-sectional views of the display apparatus of FIG. 5A.
Figure 5C:
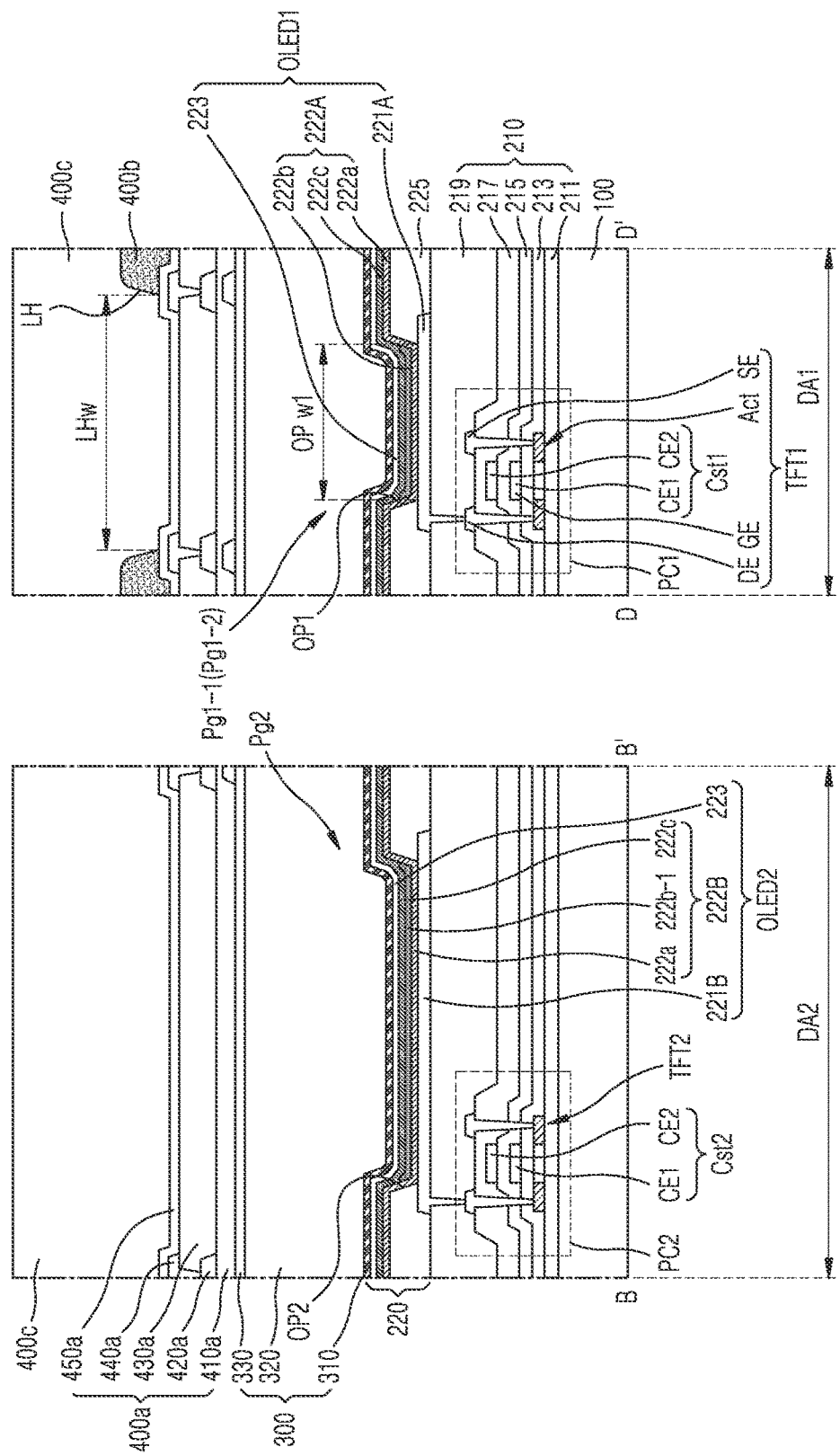

FIGS. 5B and 5C are cross-sectional views of the display apparatus of FIG. 5A. FIG. 5B is a cross-sectional view schematically illustrating the second green sub-pixel taken along the line B-B' of FIG. 5A and the 1-1st green sub-pixel or the 1-2nd green sub-pixel taken along the line C-C' of FIG. 5A. FIG. 5C is a cross-sectional view schematically illustrating the second green sub-pixel taken along the line B-B' of FIG. 5A and the 1-1st green sub-pixel or the 1-2nd green sub-pixel taken along the line D-D' of FIG. 5A.

Referring to FIGS. 5B and 5C, the display apparatus 1 may include the substrate 100, the pixel circuit layer 210, the display element layer 220, the encapsulation layer 300, the functional layer 400, a reflection prevention layer, and a cover window.

The substrate 100 may include a first display area DA1 and a second display area DA2.

The substrate 100 may include glass, or polymer resins, such as polyethersulfone, polyarylate, polyetherimide, polyethylene naphthalate, polyethylene terephthalate, polyphenylene sulfide, polyimide, polycarbonate, cellulose tri acetate, or cellulose acetate propionate. According to one or more embodiments, the substrate 100 may have a multi-layer structure including a base layer including the polymer resins described above and a barrier layer. The substrate 100 including the polymer resins may be flexible, rollable, or bendable.

The pixel circuit layer 210 may be arranged on the substrate 100. The pixel circuit layer 210 may include a buffer layer 211, a first gate insulating layer 213, a second gate insulating layer 215, an interlayer insulating layer 217, an organic insulating layer 219, a first pixel circuit PC1, and a second pixel circuit PC2. The first pixel circuit PC1 may include a first thin-film transistor TFT1 and a first storage capacitor Cst1. The first thin-film transistor TFT1 may include a semiconductor layer Act, a gate electrode GE, a source electrode SE, and a drain electrode DE. The second pixel circuit PC2 may include a second thin-film transistor TFT2 and a second storage capacitor Cst2. The second pixel circuit PC2 may be substantially the same as the first pixel circuit PC1, and thus, the first pixel circuit PC1 is primarily described in more detail.

The buffer layer 211 may be arranged on the substrate 100. The buffer layer 211 may include an inorganic insulating material, such as $SiN_x$, SiON, and $SiO_x$, and may include a single layer or multiple layers including the inorganic insulating materials described above.

The first and second thin-film transistors TFT1 and TFT2 may include the semiconductor layer Act, and the semiconductor layer Act may be arranged on the buffer layer 211. The semiconductor layer Act may include polysilicon. Alternatively, the semiconductor layer Act may include amorphous silicon, an oxide semiconductor, or an organic semiconductor. The semiconductor layer Act may include a channel area, a drain area, and a source area. The drain area and the source area may be arranged at opposite sides of the channel area, respectively.

The gate electrode GE may overlap the channel area. The gate electrode GE may include a low-resistance metal material. The gate electrode GE may include a conductive material including Mo, Al, Cu, Ti, etc. and may include multiple layers or a single layer including one or more of the conductive materials described above.

The first gate insulating layer 213 between the semiconductor layer Act and the gate electrode GE may include an inorganic insulating material, such as $SiO_x$, $SiN_x$, SiON, $Al_2O_3$, $TiO_2$, $Ta_2O_5$, $HfO_2$, ZnO, or the like.

The second gate insulating layer 215 may be provided to cover the gate electrode GE. Similarly, with the first gate insulating layer 213, the second gate insulating layer 215 may include an inorganic insulating material, such as $SiO_x$, $SiN_x$, SiON, $Al_2O_3$, $TiO_2$, $Ta_2O_5$, $HfO_2$, ZnO, or the like.

An upper electrode CE2 of the first storage capacitor Cst1 may be arranged above the second gate insulating layer 215. The upper electrode CE2 may overlap the gate electrode GE therebelow. Here, the gate electrode GE and the upper electrode CE2 overlapping each other with the second gate insulating layer 215 therebetween may be included in the first storage capacitor Cst1. That is, the gate electrode GE may function as a lower electrode CE1 of the first storage capacitor Cst1.

According to one or more embodiments, the first storage capacitor Cst1 and the first thin-film transistor TFT1 may be formed to overlap each other. The second storage capacitor Cst2 and the second thin-film transistor TFT2 may be formed to overlap each other. In some embodiments, the first storage capacitor Cst1 may not be formed to overlap the first thin-film transistor TFT1. The second storage capacitor Cst2 may not be formed to overlap the second thin-film transistor TFT2.

The upper electrode CE2 may include Al, Pt, Pd, Ag, Mg, Au, Ni, Nd, Ir, Cr, Ca, Mo, Ti, W, and/or Cu and may include a single layer or multiple layers including the materials described above.

The interlayer insulating layer 217 may cover the upper electrode CE2. The interlayer insulating layer 217 may include $SiO_2$, $SiN_x$, SiON, $Al_2O_3$, $TiO_2$, $Ta_2O_5$, $HfO_2$, ZnO, or the like. The interlayer insulating layer 217 may include a single layer or multiple layers including the inorganic insulating materials described above.

Each of the drain electrode DE and the source electrode SE may be arranged on the interlayer insulating layer 217. The drain electrode DE and the source electrode SE may include a highly conductive material. The drain electrode DE and the source electrode SE may include a conductive material including Mo, Al, Cu, Ti, etc. and may include multiple layers or a single layer including one or more of the materials described above. According to one or more embodiments, the drain electrode DE and the source electrode SE may have a multi-layer structure of Ti/Al/Ti.

The organic insulating layer 219 may be arranged to cover the drain electrode DE and the source electrode SE. The organic insulating layer 219 may include an organic insulating material, such as a general-purpose polymer such as polymethylmethacrylate (PMMA) or polystyrene (PS), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, and/or a blend thereof. In some embodiments, the organic insulating layer 219 may include a first organic insulating layer and a second organic insulating layer.

The display element layer 220 may be arranged on the pixel circuit layer 210. The display element layer 220 may be arranged on the organic insulating layer 219. The display element layer 220 may include a first organic light-emitting diode OLED1 and a second organic light-emitting diode OLED2 as display elements and may include the pixel-defining layer 225.

The first organic light-emitting diode OLED1 and the second organic light-emitting diode OLED2 may be arranged on the organic insulating layer 219. The first organic light-emitting diode OLED1 and the second organic light-emitting diode OLED2 may emit red, green, or blue light or red, green, blue, or white light. Hereinafter, a case in which the first organic light-emitting diode OLED1 and the second organic light-emitting diode OLED2 emit green light is primarily described in more detail.

The first organic light-emitting diode OLED1 may include a first electrode 221A, a first intermediate layer 222A, and a common electrode 223. The first organic light-emitting diode OLED1 may realize a first green sub-pixel Pg1. The second organic light-emitting diode OLED2 may include a second electrode 221B, a second intermediate layer 222B, and a common electrode 223. The second organic light-emitting diode OLED2 may realize a second green sub-pixel Pg2.

The first electrode 221A and the second electrode 221B may be arranged on the substrate 100. The first electrode 221A and the second electrode 221B may be arranged on the organic insulating layer 219. The first electrode 221A may overlap the first display area DA1. The second electrode 221B may overlap the second display area DA2.

The first electrode 221A and the second electrode 221B may be connected (e.g., electrically connected) to the first thin-film transistor TFT1 and a second thin-film transistor TFT2, respectively, through a contact hole of the organic insulating layer 219. At least one of the first electrode 221A or the second electrode 221B may include a conductive oxide, such as ITO, IZO, ZnO, $In_2O_3$, IGO, or AZO. According to one or more embodiments, at least one of the first electrode 221A or the second electrode 221B may include a reflective layer including Ag, Mg, Al, Pt, Pd, Au, Ni, Nd, Ir, Cr, or a compound thereof. According to one or more embodiments, at least one of the first electrode 221A or the second electrode 221B may further include a layer including ITO, IZO, ZnO, or $In_2O_3$ above/below the reflective layer described above. For example, at least one of the first electrode 221A or the second electrode 221B may have a multi-layer structure of ITO/Ag/ITO.

The pixel-defining layer 225 may cover an edge of the first electrode 221A and an edge of the second electrode 221B. The pixel-defining layer 225 may include the first opening portion OP1 and a second opening portion OP2. The first opening portion OP1 may expose a central portion of the first electrode 221A. Together with the hole LH, the first opening portion OP1 may define an emission area (or a pixel area) of light emitted from the first organic light-emitting diode OLED1. According to one or more embodiments, a size of the first opening portion OP1 may be part of a size of the first green sub-pixel Pg1. A width OPw1 of the first opening portion OP1 may be greater than or equal to a width w1 of the first green sub-pixel Pg1. The width OPw1 of the first opening portion OP1 may be defined as a shortest distance between side surfaces of the pixel-defining layer 225 defining the first opening portion OP1.

The second opening portion OP2 may expose a central portion of the second electrode 221B. The second opening portion OP2 may define an emission area of light emitted from the second organic light-emitting diode OLED2. According to one or more embodiments, a size of the second opening portion OP2 may correspond to a size of the second green sub-pixel Pg2. A width of the second opening portion OP2 may correspond to a width of the second green sub-pixel Pg2. The width of the second opening portion OP2 may be defined as a shortest distance between side surfaces of the pixel-defining layer 225 defining the second opening portion OP2.

The first intermediate layer 222A may include a first functional layer 222a, a first emission layer 222b, and a second functional layer 222c. The second intermediate layer 222B may include the first functional layer 222a, a second emission layer 222b-1, and the second functional layer 222c. The first emission layer 222b and the second emission layer 222b-1 may include a high-molecular-weight or low-molecular-weight organic material emitting a color (e.g., a predetermined color) of light.

According to one or more embodiments, at least one of the first functional layer 222a or the second functional layer 222c may be a common layer arranged throughout a display area. The first functional layer 222a may include, for example, a hole transport layer (HTL) and/or a hole injection layer (HIL). The second functional layer 222c may include an electron transport layer (ETL) and/or an electron injection layer (EIL). In some embodiments, the second functional layer 222c may be omitted.

The common electrode 223 may be arranged on the first emission layer 222b and the second emission layer 222b-1. The common electrode 223 may include a conductive material having a low work function. For example, the common electrode 223 may include a (semi) transparent layer including Ag, Mg, Al, Pt, Pd, Au, Ni, Nd, Ir, Cr, Li, Ca, or an alloy thereof. Alternatively, the common electrode 223 may further include a layer, such as ITO, IZO, ZnO, or $In_2O_3$, on the (semi) transparent layer including the materials described above.

In some embodiments, a capping layer may further be arranged on the common electrode 223. The capping layer may include LiF, an inorganic material, and/or an organic material.

The encapsulation layer 300 may be arranged on the display element layer 220. The encapsulation layer 300 may cover the first organic light-emitting diode OLED1 and the second organic light-emitting diode OLED2. According to one or more embodiments, the encapsulation layer 300 may include at least one inorganic encapsulation layer and at least one organic encapsulation layer. FIGS. 5B and 5C illustrate that the encapsulation layer 300 includes a first inorganic encapsulation layer 310, a first organic encapsulation layer 320, and a second inorganic encapsulation layer 330 that are sequentially stacked.

The at least one inorganic encapsulation layer may include one or more inorganic materials from among $Al_2O_3$, $TiO_2$, $Ta_2O_5$, $HfO_2$, ZnO, $SiO_2$, $SiN_x$, and/or SiON. According to one or more embodiments, the first inorganic encapsulation layer 310 may include SiON. The second inorganic encapsulation layer 330 may include $SiN_x$.

The at least one organic encapsulation layer may include a polymer-based material. The polymer-based material may include acryl-based resins, epoxy-based resins, polyimide, polyethylene, etc. According to one or more embodiments, the at least one organic encapsulation layer may include acrylate.

The functional layer 400 may be arranged on the encapsulation layer 300. The functional layer 400 may be arranged on the second inorganic encapsulation layer 330. The functional layer 400 may include the first layer 400a and the second layer 400b.

The first layer 400a may be arranged on the encapsulation layer 300. Here, the first layer 400a may be a touch sensor layer. The first layer 400a may include a plurality of first and second conductive patterns 420a and 440a, a first sensing insulating layer 410a, a second sensing insulating layer 430a, and a third sensing insulating layer 450a.

The first sensing insulating layer 410a may be arranged on an encapsulation layer 300. Also, the first conductive patterns 420a may be arranged on the first sensing insulating layer 410a and may be covered by the second sensing insulating layer 430a. Also, the second conductive patterns 440a may be arranged on the second sensing insulating layer 430a and may be covered by the third sensing insulating layer 450a. Each of the first sensing insulating layer 410a, the second sensing insulating layer 430a, and the third sensing insulating layer 450a may include at least one of an inorganic material or an organic material.

Each of the first and second conductive patterns 420a and 440a may have conductivity (e.g., include a conductive material). Each of the first and second conductive patterns 420a and 440a may be provided as a single layer or a plurality of layers. Also, at least one of the first or second conductive patterns 420a or 440a may be provided as mesh lines in a plan view.

The mesh lines included in the first and second conductive patterns 420a and 440a may not overlap the first emission layer 222b or the second emission layer 222b-1 in a plan view. Thus, even when the first layer 400a is directly formed on a display panel DP, light formed by pixels of the display panel DP may be provided to a user without interference of the first layer 400a.

A light blocking layer, which is the second layer 400b, may be arranged on the first layer 400a. The light blocking layer may at least partially absorb external light or internal reflection light as described above. The light blocking layer may include black pigments. The light blocking layer may include a black matrix.

The third layer 400c, which is a planarization layer, may be arranged on the second layer 400b. Here, an upper surface of the third layer 400c may be flat or approximately flat. The third layer 400c may include an organic insulating material, such as acryl-based resins, epoxy-based resins, polyimide, polyethylene, etc. According to one or more embodiments, the third layer 400c may include polydiarylsiloxane, methyltrimethoxysilane, tetramethoxysilane or the like. A reflection prevention layer 500 and a cover window 20 may be arranged on the third layer 400c, as illustrated in FIG. 2A.

Referring to FIGS. 5B and 5C, the second layer 400b, which is the light blocking layer, may be arranged on the first layer 400a. The second layer 400b may be arranged on the first display area DA1. According to one or more embodiments, the second layer 400b may not be arranged on the second display area DA2. The second layer 400b may be arranged to be spaced from or apart from the second display area DA2.

The second layer 400b may include the hole LH overlapping the first opening portion OP1. The hole LH may overlap the first green sub-pixel Pg1. The hole LH may overlap at least a portion of the first electrode 221A.

A width LHw of the hole LH and the width OPw1 of the first opening portion OP1 may be different from each other in the crossing direction CDR or the extension direction EDR. For example, with respect to the 1-1st green sub-pixel Pg1-1 illustrated in FIG. 5A, the width LHw of the hole LH may be less than the width OPw1 of the first opening portion OP1 in the extension direction EDR as illustrated in FIG. 5B. With respect to the 1-1st green sub-pixel Pg1-1, the width LHw of the hole LH may be greater than the width OPw1 of the first opening portion OP1 in the crossing direction CDR as illustrated in FIG. 5C. However, with respect to the 1-2nd green sub-pixel Pg1-2 illustrated in FIG. 5A, the width LHw of the hole LH may be greater than the width OPw1 of the first opening portion OP1 in the extension direction EDR, as illustrated in FIG. 5C. Also, with respect to the 1-2nd green sub-pixel Pg1-2 illustrated in FIG. 5A, the width LHw of the hole LH may be less than the width OPw1 of the first opening portion OP1 in the crossing direction CDR, as illustrated in FIG. 5B.

When the second layer 400b is arranged as described above, the brightness may decrease by 10% or less when a viewing angle is equal to or greater than 45 degrees. In this case, the second layer 400b may reduce an amount of light emitted from the first organic light-emitting diode OLED1, and proceeding in a direction crossing the third direction (e.g., the z direction or the −z direction). Thus, the light proceeding from the first organic light-emitting diode OLED1 in the direction crossing the third direction (e.g., the z direction or the −z direction) may at least partially be removed or blocked. The light emitted from the first organic light-emitting diode OLED1 may reach a user of the display apparatus 1 (see FIG. 1), but may not reach others around the user. That is, the display apparatus 1 may provide a narrow viewing angle in the first display area DA1.

Figure 5D:
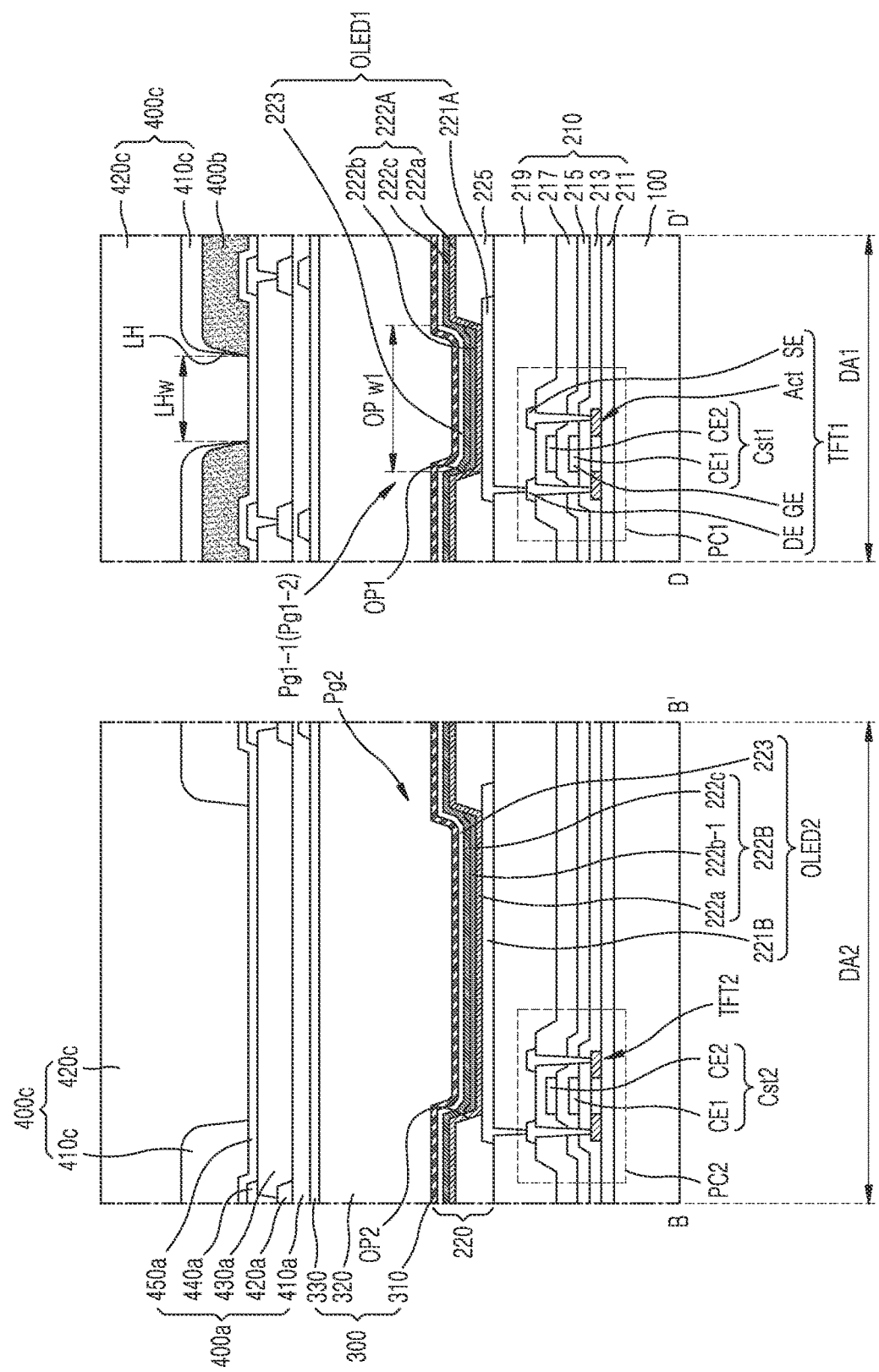
FIGS. 5D and 5E are cross-sectional views of the display apparatus of FIG. 5A
Figure 5E:
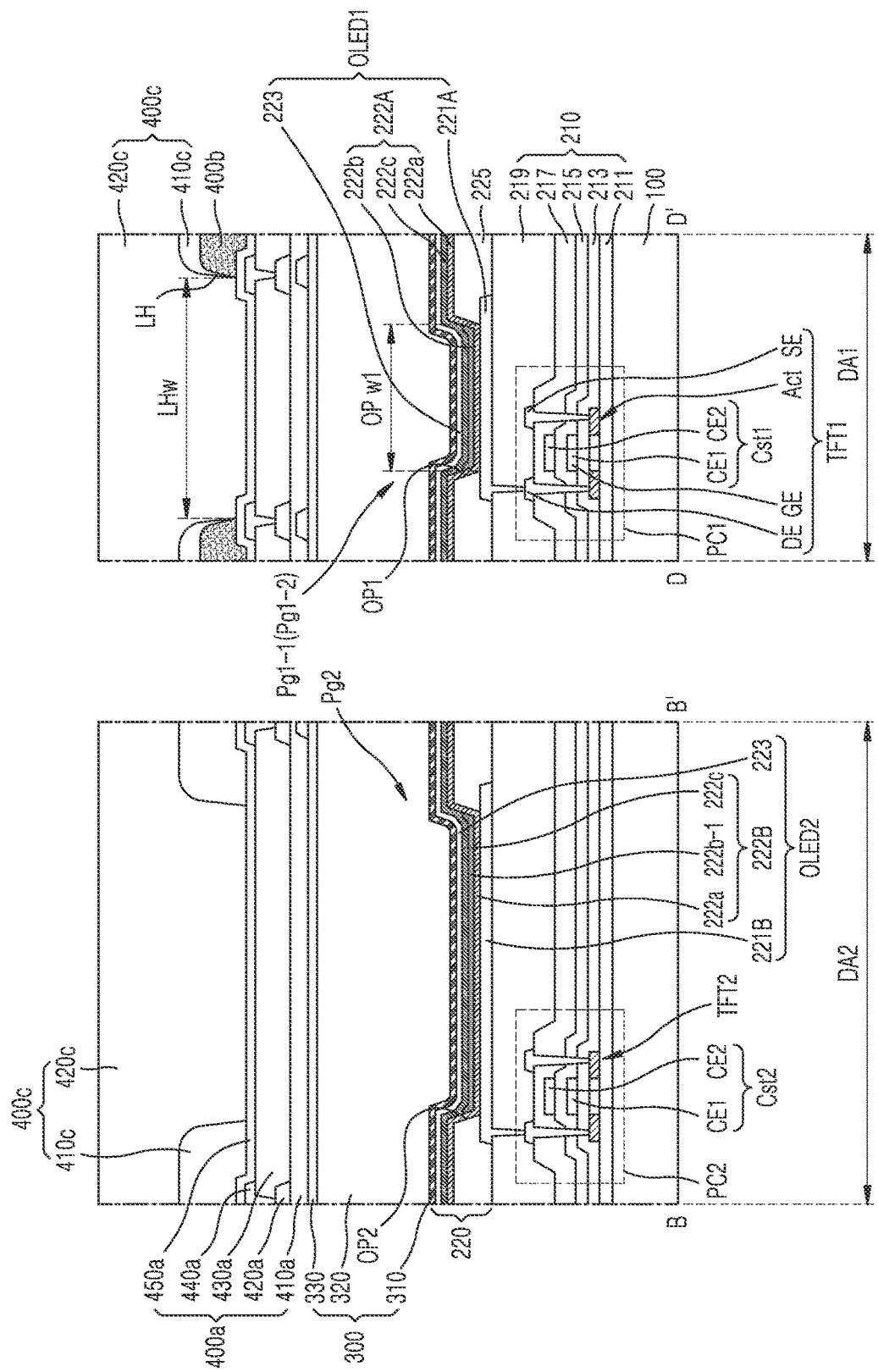

FIGS. 5D and 5E are cross-sectional views of the display apparatus of FIG. 5A.

Referring to FIGS. 5D and 5E, the display apparatus 1 may include the substrate 100, the pixel circuit layer 210, the display element layer 220, the encapsulation layer 300, the functional layer 400, a reflection prevention layer 500, and a cover window 20, as illustrated in FIG. 2A. Here, the substrate 100, the pixel circuit layer 210, the display element layer 220, the encapsulation layer 300, the reflection prevention layer 500, and the cover window 20 may be the same or substantially the same as described above, and thus, may not be described in more detail.

The functional layer 400 may include the first layer 400a, the second layer 400b, and the third layer 400c. Here, the first layer 400a may be a touch sensor layer, and the second layer 400b may be a light blocking layer. In this case, the first layer 400a and the second layer 400b may be the same or substantially the same as described above with reference to FIGS. 5A through 5C, and thus, may not be described in more detail.

The third layer 400c may include a first refractive layer 410c and a second refractive layer 420c. Here, the first refractive layer 410c may be arranged on an upper surface of the second layer 400b, which is the light blocking layer, and may be arranged to be spaced from or apart from each other like the second layer 400b. Also, the first refractive layer 410c may be arranged to correspond to a second pixel area arranged on the second display area DA2. In this case, the first refractive layer 410c may be arranged to be spaced from or apart from each other not to overlap the second opening portion OP2 of the pixel-defining layer 225 arranged on the second display area DA2. Here, the first refractive layer 410c may include a light transmissive inorganic or organic material having low refractivity. Also, the second refractive layer 420c may be arranged on the first refractive layer 410c. In this case, the second refractive layer 420c may cover the upper surface (e.g., the entire upper surface) of the substrate 100 and may planarize or approximately planarize an upper surface of the second refractive layer 420c. Here, a refractivity of the second refractive layer 420c may be greater than a refractivity of the first refractive layer 410c. In this case, the second refractive layer 420c may include a light-transmissive inorganic or organic material having high refractivity. In this case, a relationship between the width LHw of the hole LH and the width OPw1 of the first opening portion OP1 arranged in the first display area DA1 may be the same or substantially the same as described above.

Figure 5F:
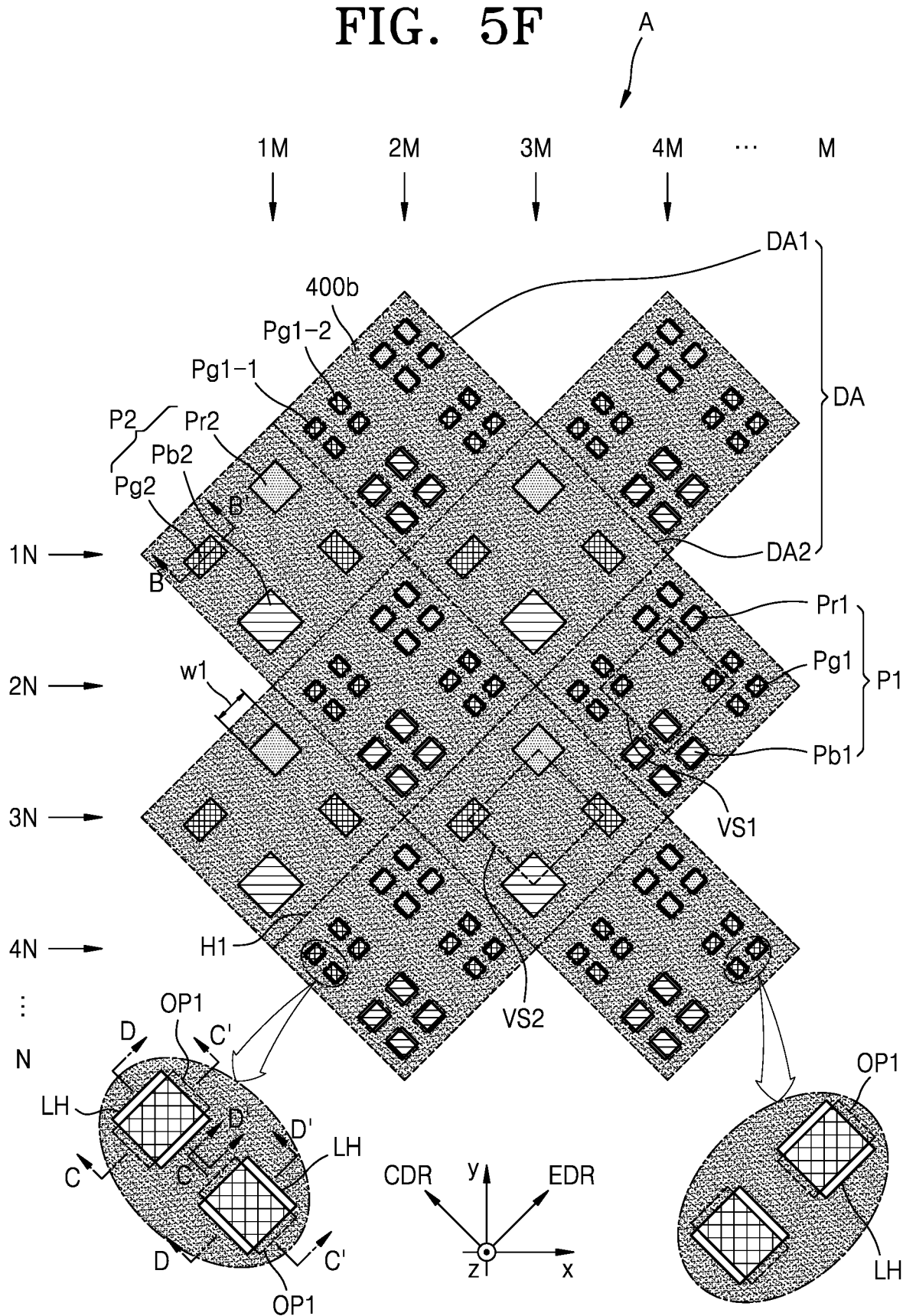
FIG. 5F is an enlarged view of a display area of a display apparatus according to one or more embodiments.
Figure 5G:
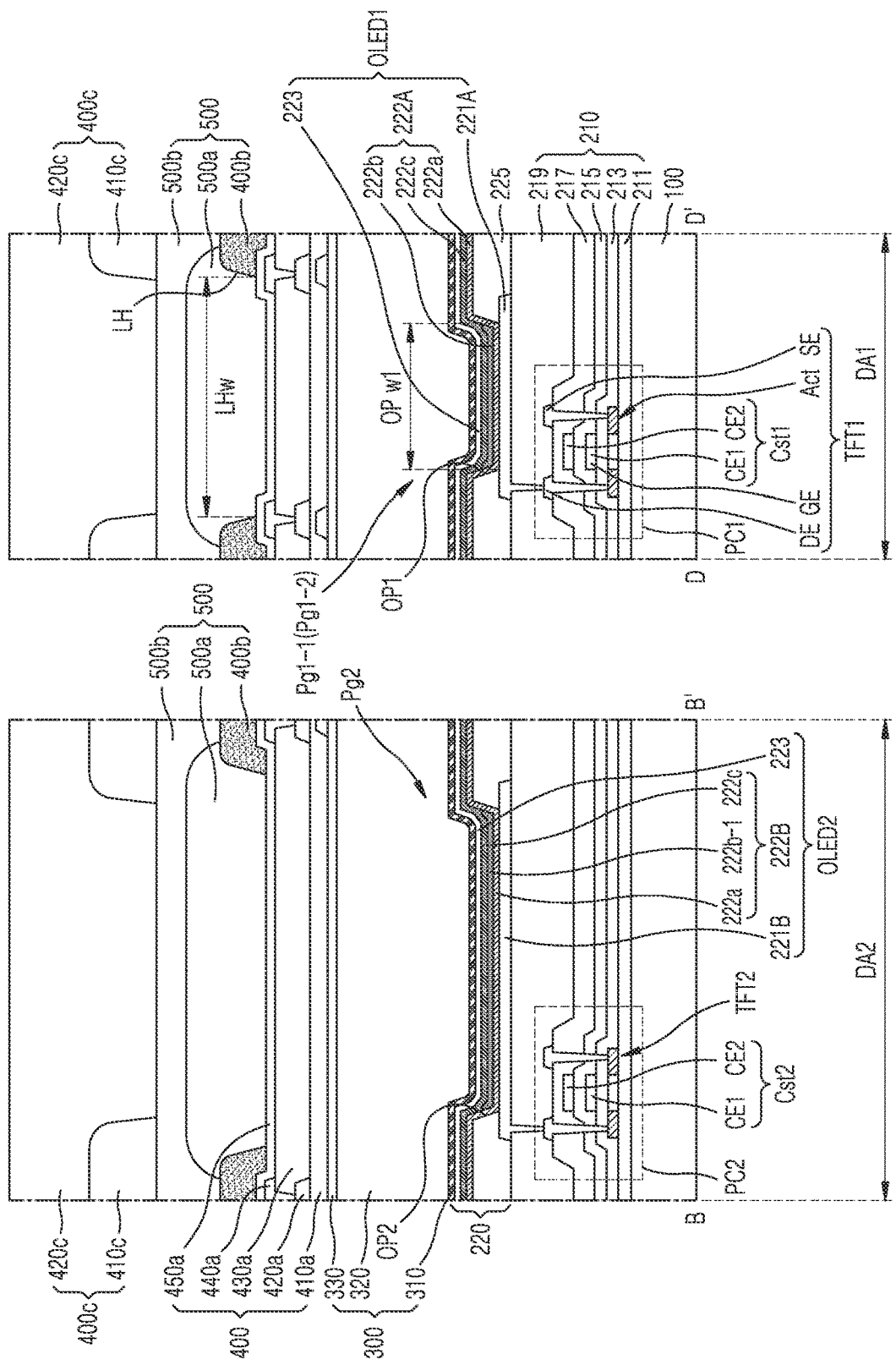
FIGS. 5G and 5H are cross-sectional views of the display apparatus of FIG. 5F.
Figure 5H:
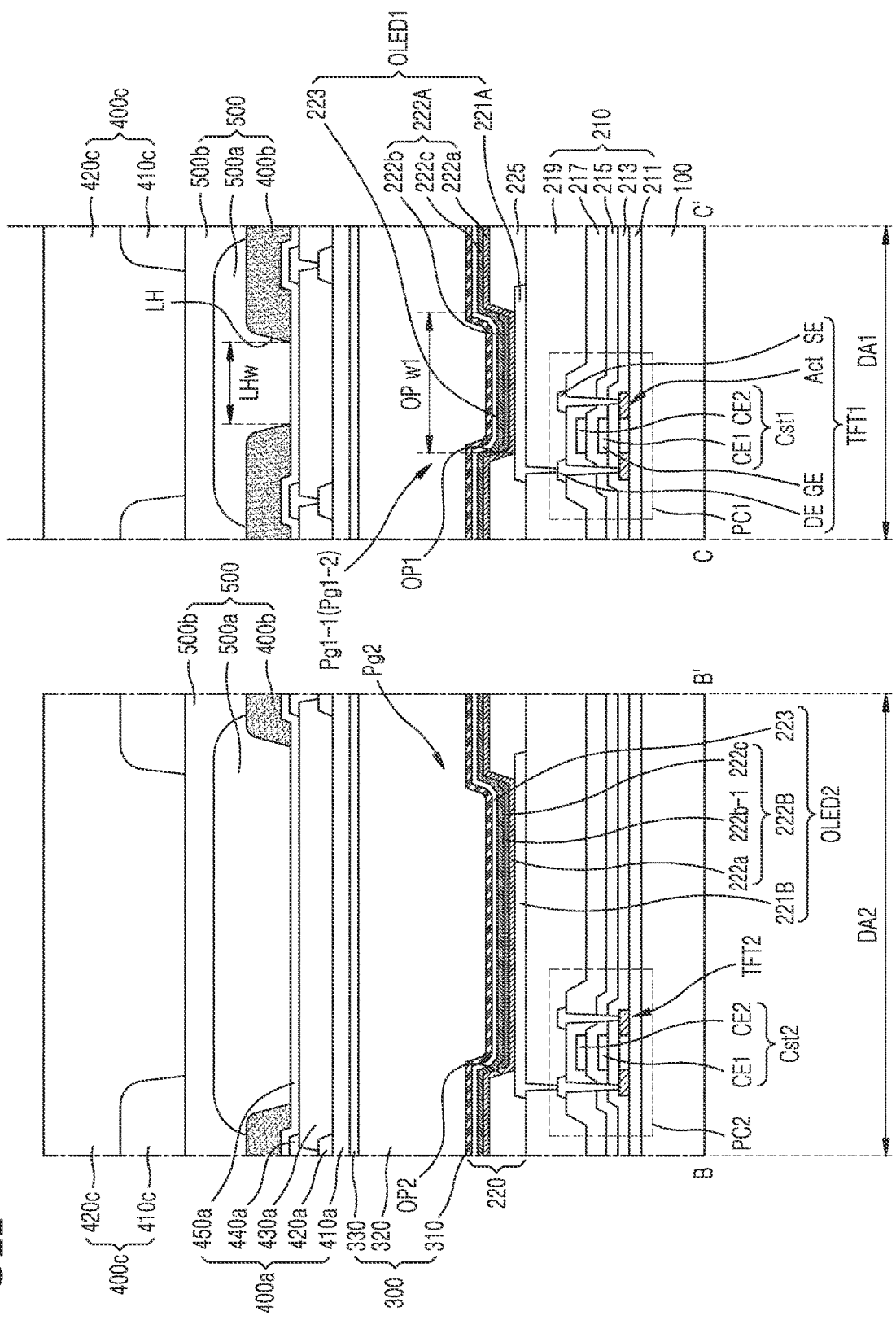

FIG. 5F is an enlarged view of a display area of the display apparatus according to one or more embodiments. FIGS. 5G and 5H are cross-sectional views of the display apparatus of FIG. 5B. FIG. 5G is a cross-sectional view schematically illustrating the second green sub-pixel taken along the line B-B' of FIG. 5F and the 1-1st green sub-pixel or the 1-2nd green sub-pixel taken along the line C-C' of FIG. 5F. FIG. 5H is a cross-sectional view schematically illustrating the second green sub-pixel taken along the line B-B' of FIG. 5F and the 1-1st green sub-pixel or the 1-2nd green sub-pixel taken along the line D-D' of FIG. 5F.

Referring to FIGS. 5F through 5H, the display apparatus 1 may include the substrate 100, the pixel circuit layer 210, the display element layer 220, the encapsulation layer 300, the functional layer 400, the reflection prevention layer 500, and a cover window, as illustrated in FIG. 2B. Here, the substrate 100, the pixel circuit layer 210, the display element layer 220, the encapsulation layer 300, and the cover window may be the same or substantially the same as described above, and thus, may not be described in more detail.

The reflection prevention layer 500 may include the light blocking layer 400b, a color filter 500a, and an overcoat layer 500b. Also, the functional layer 400 may include the first layer 400a and the third layer 400c, which are touch electrode layers. In this case, the light blocking layer 400b of the reflection prevention layer 500 may be the same or substantially the same as the second layer 400b of the functional layer 400 described with reference to FIG. 2A.

The color filter 500a may at least partially overlap the first emission layer 222b or the second emission layer 222b-1 arranged therebelow. Here, the color filters 500a may be arranged to be spaced from or apart from each other to correspond to the first emission layer 222b or the second emission layer 222b-1. Also, the color filters 500a may be arranged to be spaced from or apart from each other to correspond to the first emission layers 222b, respectively, and may be arranged to be spaced from or apart from each other to correspond to the second emission layers 222b-1, respectively. The color filter 500a may selectively transmit light corresponding to light provided from the first emission layer 222b or the second emission layer 222b-1. For example, the color filter 500a illustrated in FIGS. 5G and 5F may be a green color filter transmitting green light.

The color filter 500a may include high-molecular-weight photosensitive resins, pigments, or dyes. Here, the color filter 500a may include pigments or dyes corresponding to the light emitted from the first emission layer 222b or the second emission layer 222b-1. According to one or more embodiments, the color filter 500a may include transparent photosensitive resins.

The overcoat layer 500b may be arranged on the color filter 500a. The overcoat layer 500b may be a transmissive layer not having a color in a visible light band and may encircle protrusion portions generated in a process of forming the color filter 500a and the light blocking layer 400b and provide a flat upper surface.

The third layer 400c may be arranged on the overcoat layer 500b. Here, the third layer 400c may include the first refractive layer 410c and the second refractive layer 420c. In this case, the first refractive layer 410c may be formed to have a similar pattern type as illustrated in FIGS. 5D and 5E so as to correspond to the first pixel area of the first display area DA1 and the second pixel area of the second display area DA2. The second refractive layer 420c may be arranged between adjacent first refractive layers 410c and on upper surfaces of the first refractive layers 410c. In this case, the first refractive layer 410c and the second refractive layer 420c may be the same or substantially the same as described above with reference to FIGS. 5D and 5E, and thus, may not be described in more detail.

In this case, a relationship between the width LHw of the hole LH and the width OPw1 of the first opening portion OP1 arranged in the first display area DA1 may be the same or substantially the same as described above.

Figure 6:
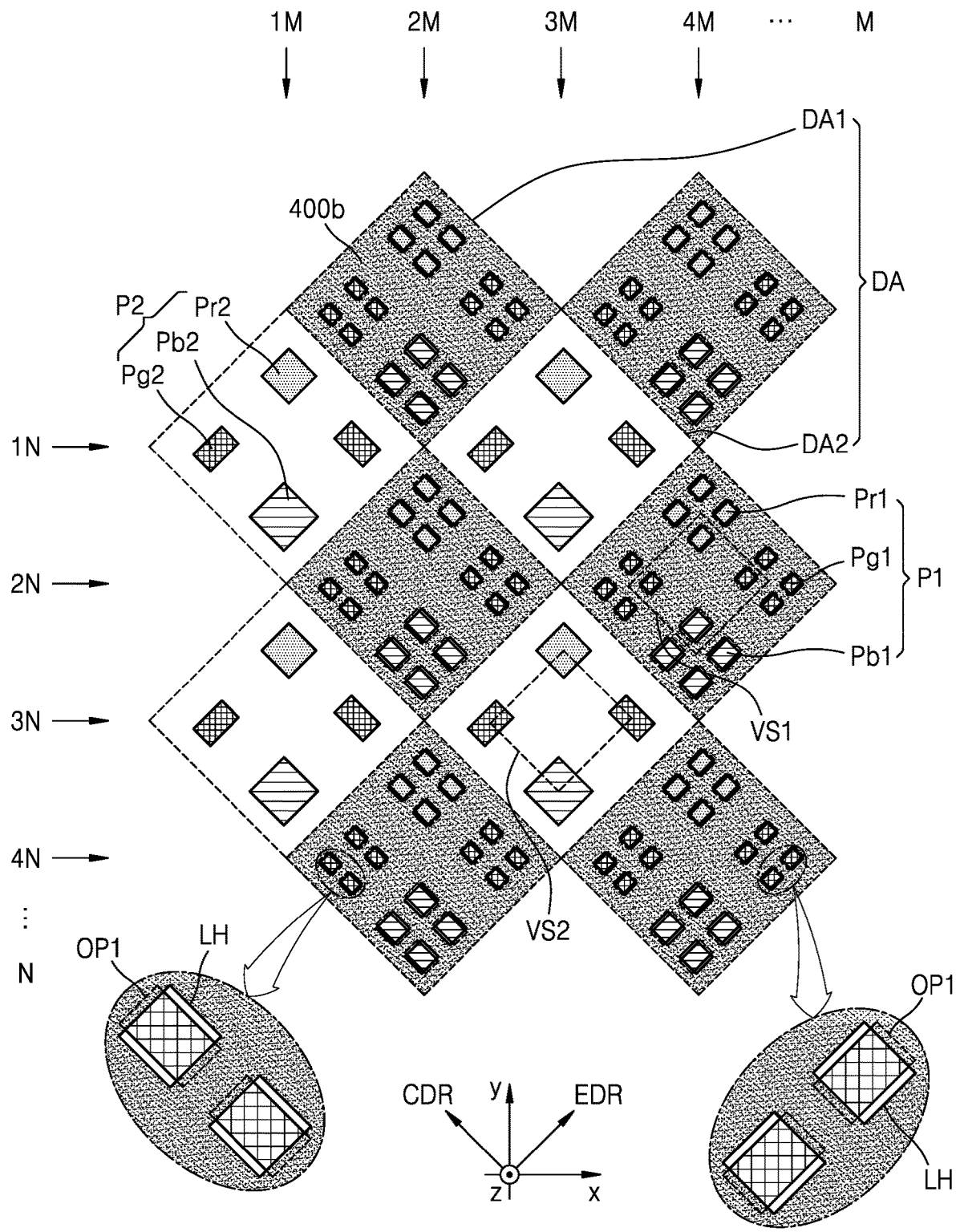
FIG. 6 is a schematic plan view of a display apparatus according to one or more embodiments.

FIG. 6 is a schematic plan view of a display apparatus according to one or more embodiments.

Referring to FIG. 6, a display area DA may include a first display area DA1 and a second display area DA2. Here, the first display area DA1 and the second display area DA2 may be arranged to be substantially the same as described above with reference to FIG. 5A.

A first sub-pixel P1 and a second sub-pixel P2 may be arranged in the first display area DA1 and the second display area DA2, respectively. Here, the second sub-pixel P2 may include a second red sub-pixel Pr2, a second green sub-pixel Pg2, and a second blue sub-pixel Pb2 and may be the same or substantially the same as described above with reference to FIG. 5A.

The first sub-pixel P1 may include a first red sub-pixel Pr1, a first green sub-pixel Pg1, and a first blue sub-pixel Pb1. Here, at least one of the first red sub-pixel Pr1, the first green sub-pixel Pg1, or the first blue sub-pixel Pb1 may have at least one of a rectangular shape, a square shape, or a diamond shape. Hereinafter, for convenience of explanation, a case in which all of the first red sub-pixel Pr1, the first green sub-pixel Pg1, and the first blue sub-pixel Pb1 have a rectangular shape is primarily described in more detail. Also, the first red sub-pixel Pr1, the first green sub-pixel Pg1, and the first blue sub-pixel Pb1 may be substantially the same as one another, and thus, hereinafter, for convenience of explanation, the first green sub-pixel Pg1 is described in more detail.

The first green sub-pixel Pg1 may be provided in a multiple number (i.e., a plurality of first green sub-pixels Pg1 may be provided) and may be arranged on a unit first display area DA1. Here, the first green sub-pixels Pg1 having the same shape may be arranged on the unit first display area DA1. For example, in some of the plurality of first display areas DA1, only the shape of the 1-1st green sub-pixel Pg1-1 illustrated in FIG. 5A may be arranged, and in the others of the plurality of first display areas DA1, only the shape of the 1-2nd green sub-pixel Pg1-2 illustrated in FIG. 5A may be arranged. That is, in the first display area DA1 which is left with respect to the second display area DA2 of FIG. 6, the 1-2nd green sub-pixels Pg1-2 illustrated in FIG. 5A may be arranged, and in the first display area DA1 which is right with respect to the second display area DA2, the 1-1st green sub-pixels Pg1-1 illustrated in FIG. 5A may be arranged.

In this case, the first green sub-pixel Pg1 may be formed to be the same as described above. For example, a portion of the planar shape of the first opening portion OP1 may be arranged in the planar shape of the hole LH, and the other portion of the planar shape of the first opening portion OP1 may outwardly protrude from the planar shape of the hole LH. Here, the planar shape of the first opening portion OP1 may have a rectangular shape, and the planar shape of the hole LH may have a square shape or a diamond shape. However, the present disclosure is not limited thereto.

Figure 7:
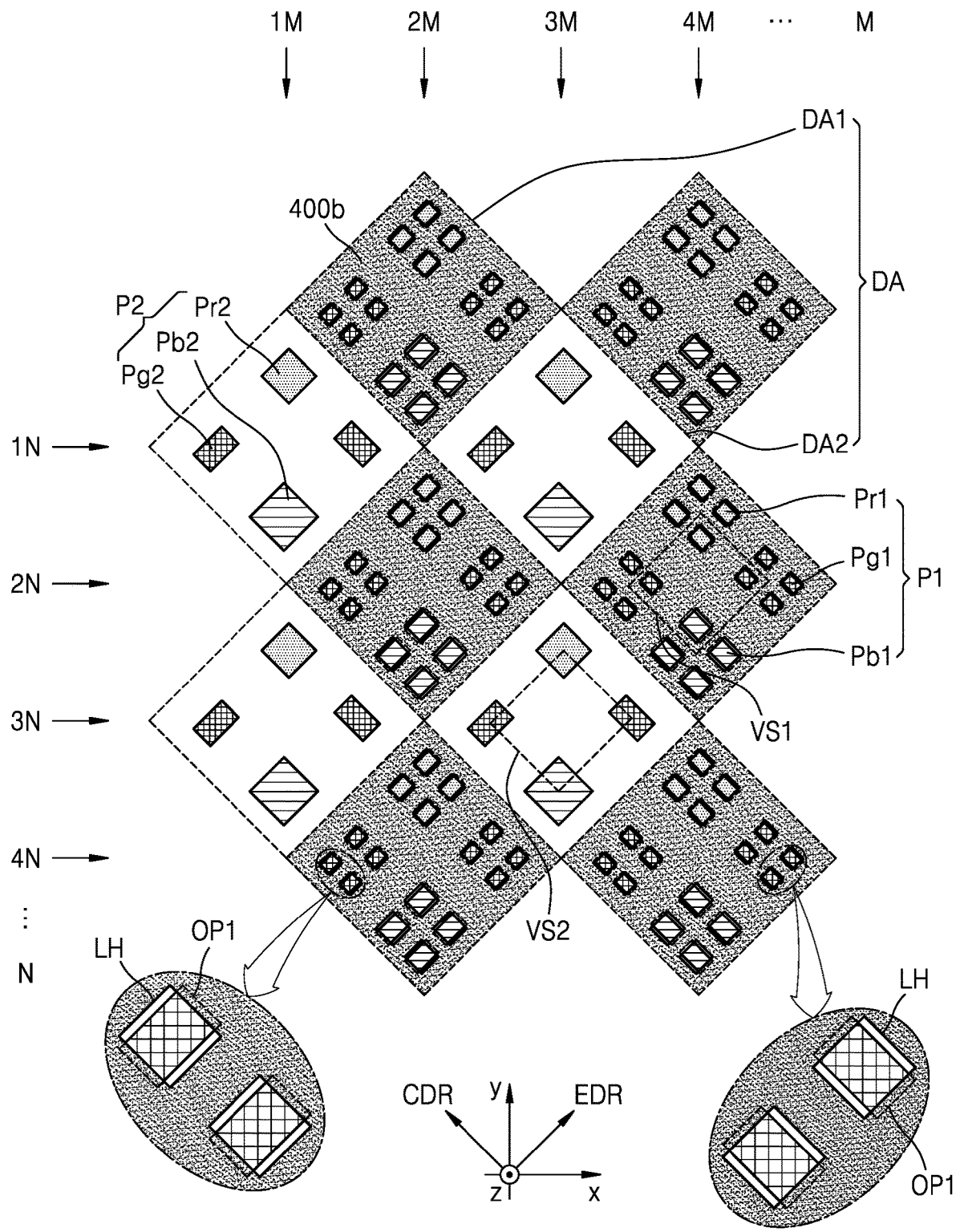
FIG. 7 is a schematic plan view of a display apparatus according to one or more embodiments.

FIG. 7 is a schematic plan view of a display apparatus according to one or more embodiments.

Referring to FIG. 7, a display area DA may include a first display area DA1 and a second display area DA2. Here, the first display area DA1 and the second display area DA2 may be arranged to be substantially the same as described above with reference to FIG. 5A.

A first sub-pixel P1 and a second sub-pixel P2 may be arranged in the first display area DA1 and the second display area DA2, respectively. Here, the second sub-pixel P2 may include a second red sub-pixel Pr2, a second green sub-pixel Pg2, and a second blue sub-pixel Pb2 and may be the same or substantially the same as described above with reference to FIG. 5A.

The first sub-pixel P1 may include a first red sub-pixel Pr1, a first green sub-pixel Pg1, and a first blue sub-pixel Pb1. Here, the first sub-pixel P1 may be formed and arranged to be substantially the same as described above with reference to FIG. 6. In this case, the first red sub-pixel Pr1, the first green sub-pixel Pg1, and the first blue sub-pixel Pb1 may be the same or substantially the same as one another, and thus, hereinafter, for convenience of explanation, the first green sub-pixel Pg1 is primarily described in more detail.

In this case, the first green sub-pixel Pg1 may be formed to be the opposite to the illustration of FIG. 6. That is, the first green sub-pixel Pg1 arranged in series in a second column 2M in FIG. 7 may be arranged in the same direction and may have the same shape as the first green sub-pixel Pg1 arranged in series in a fourth column 4M of FIG. 6. Also, the first green sub-pixel Pg1 serially arranged in a fourth column 4M in FIG. 7 may be arranged in the same direction and may have the same shape as the first green sub-pixel Pg1 serially arranged in a second column 2M of FIG. 6.

In this case, the relationship between the first opening portion OP1 and the hole LH may be the same or substantially the same as described above with reference to FIG. 6.

Figure 8:
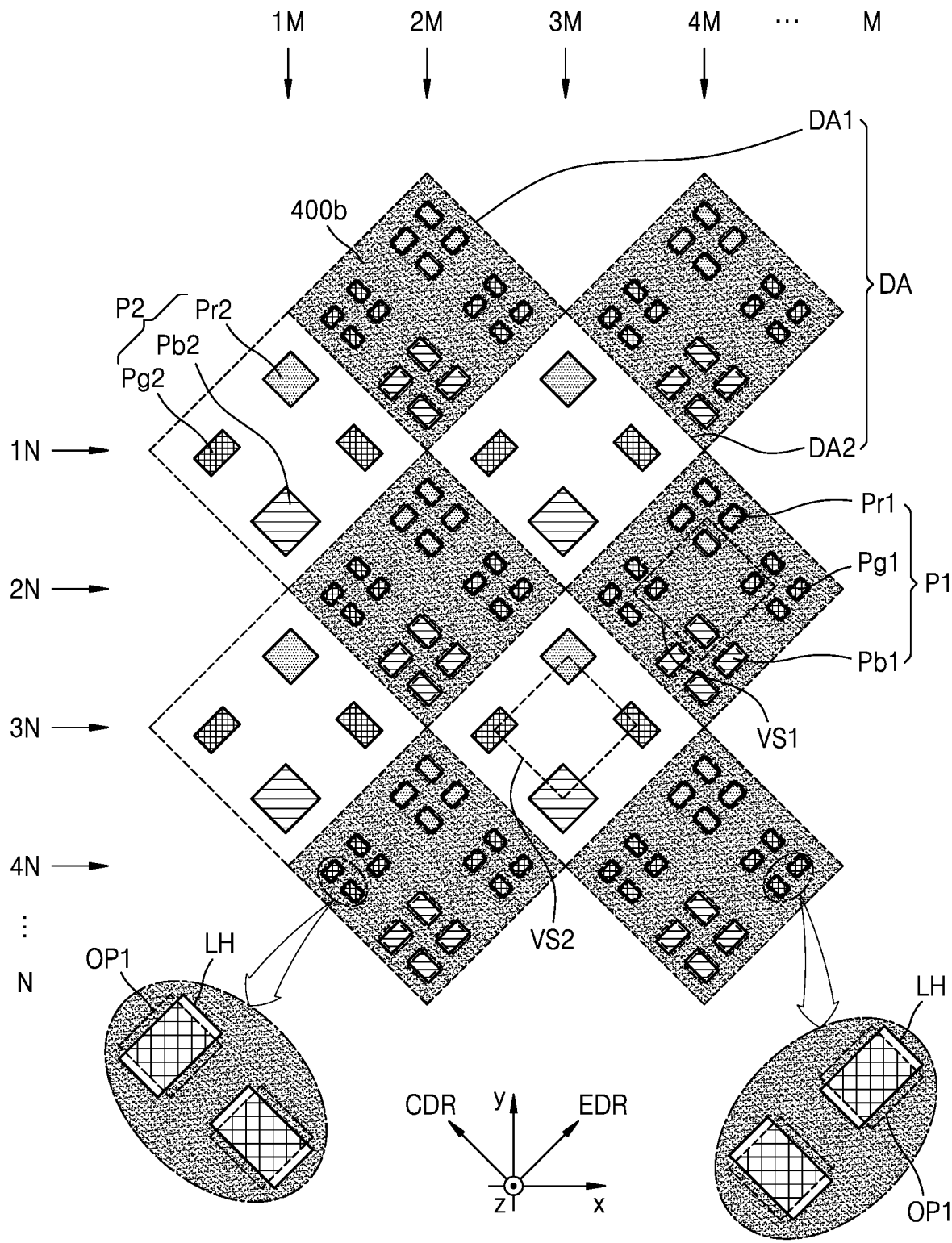
FIG. 8 is a schematic plan view of a display apparatus according to one or more embodiments.

FIG. 8 is a schematic plan view of a display apparatus according to one or more embodiments.

Referring to FIG. 8, a display area DA may include a first display area DA1 and a second display area DA2. Here, the first display area DA1 and the second display area DA2 may be arranged to be substantially the same as described above with reference to FIG. 5A.

A first sub-pixel P1 and a second sub-pixel P2 may be arranged in the first display area DA1 and the second display area DA2, respectively. Here, the second sub-pixel P2 may include a second red sub-pixel Pr2, a second green sub-pixel Pg2, and a second blue sub-pixel Pb2 and may be the same or substantially the same as described above with reference to FIG. 5A.

The first sub-pixel P1 may include a first red sub-pixel Pr1, a first green sub-pixel Pg1, and a first blue sub-pixel Pb1. Here, the first sub-pixel P1 may be arranged to be the same as described above with reference to FIG. 5A. The first red sub-pixel Pr1, the first green sub-pixel Pg1, and the first blue sub-pixel Pb1 may be the same or substantially the same as one another, and thus, hereinafter, for convenience of explanation, the first green sub-pixel Pg1 is primarily described in more detail.

In this case, the relationship between the first opening portion OP1 and the hole LH may be the opposite to the illustration of FIG. 5A. That is, the planar shape of the first opening portion OP1 may be a square or a diamond, and the planar shape of the hole LH may be a rectangle. Here, in a plan view, the planar shape of the hole LH and the planar shape of the first opening portion OP1 may overlap each other. In this case, a portion of the planar shape of the hole LH may be arranged in the planar shape of the first opening portion OP1, and the other portion of the planar shape of the hole LH may outwardly protrude from the planar shape of the first opening portion OP1. In this case, a portion at which the planar shape of the hole LH and the planar shape of the first opening portion OP1 overlap each other may be the first green sub-pixel Pg1, and only this first green sub-pixel Pg1 may be seen from the outside.

In this case, the hole LH corresponding to some of the plurality of first green sub-pixels Pg1 arranged in a unit first display area DA1 may outwardly protrude from the first opening portion OP1 in the crossing direction CDR, and the hole LH corresponding to the others of the plurality of first green sub-pixels Pg1 arranged in the unit first display area DA1 may outwardly protrude from the first opening portion OP1 in the extension direction EDR.

Figure 9:
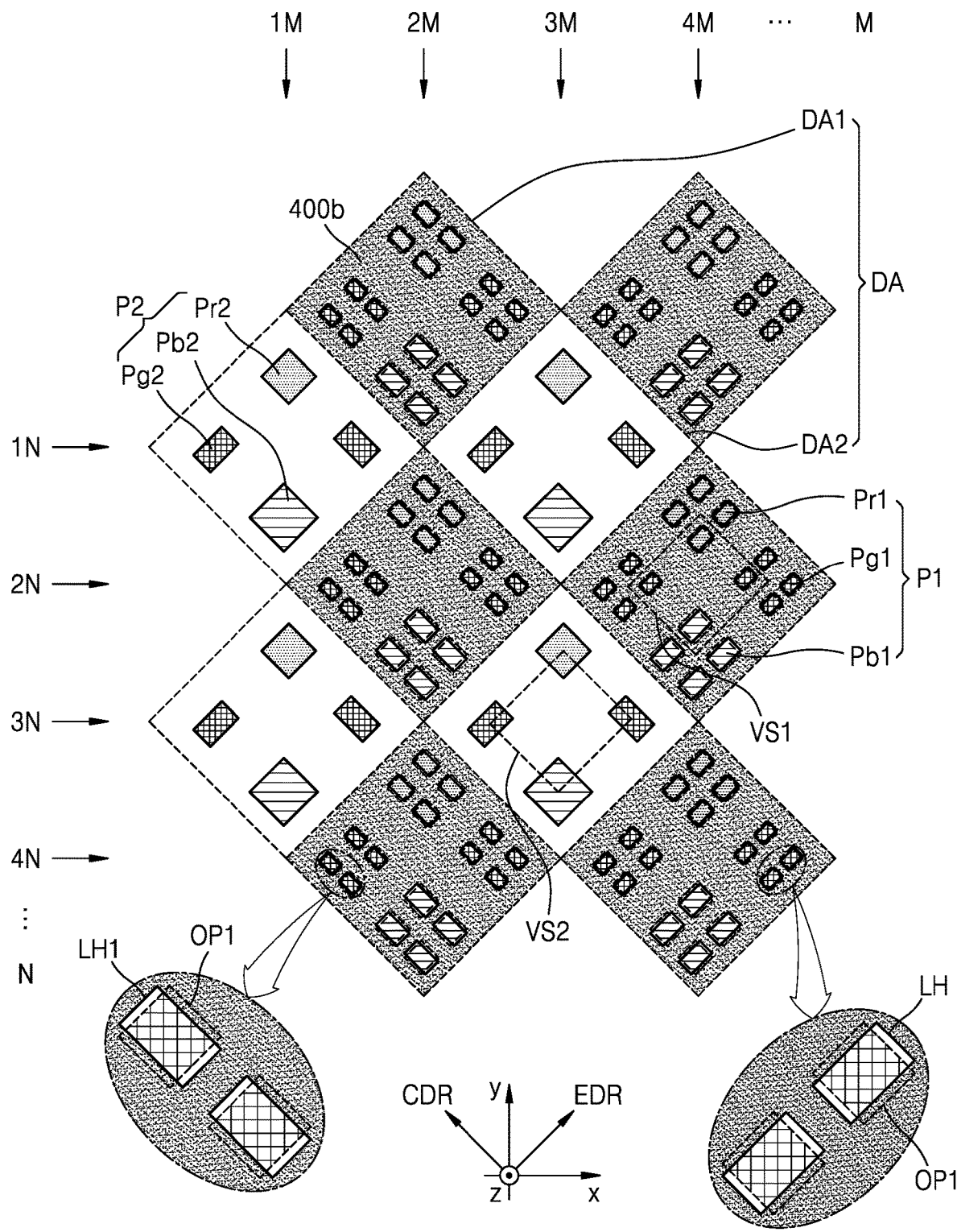
FIG. 9 is a schematic plan view of a display apparatus according to one or more embodiments.

FIG. 9 is a schematic plan view of a display apparatus according to one or more embodiments.

Referring to FIG. 9, a display area DA may include a first display area DA1 and a second display area DA2. Here, the first display area DA1 and the second display area DA2 may be arranged to be substantially the same as described above with reference to FIG. 5A.

A first sub-pixel P1 and a second sub-pixel P2 may be arranged in the first display area DA1 and the second display area DA2, respectively. Here, the second sub-pixel P2 may include a second red sub-pixel Pr2, a second green sub-pixel Pg2, and a second blue sub-pixel Pb2 and may be the same or substantially the same as described above with reference to FIG. 5A.

The first sub-pixel P1 may include a first red sub-pixel Pr1, a first green sub-pixel Pg1, and a first blue sub-pixel Pb1. Here, the first sub-pixel P1 may be arranged to be the same as described above with reference to FIG. 6. The first red sub-pixel Pr1, the first green sub-pixel Pg1, and the first blue sub-pixel Pb1 may be the same or substantially the same as one another, and thus, for convenience of explanation, the first green sub-pixel Pg1 is primarily described in more detail.

Shapes and the locational relationship (or spatial relationship) of the first opening portion OP1 and the hole LH arranged to correspond to the first green sub-pixels Pg1 may be substantially the same as described with reference to FIG. 8. Here, the first green sub-pixels Pg1 arranged in the same column may have the same shape and the same arrangement. However, the first green sub-pixels Pg1 arranged in different columns may be tilted in different directions from each other. For example, a longitudinal direction of the first green sub-pixel Pg1 arranged in a second column M2 may be different from a longitudinal direction of the first green sub-pixel Pg1 arranged in a fourth column M4.

Figure 10:
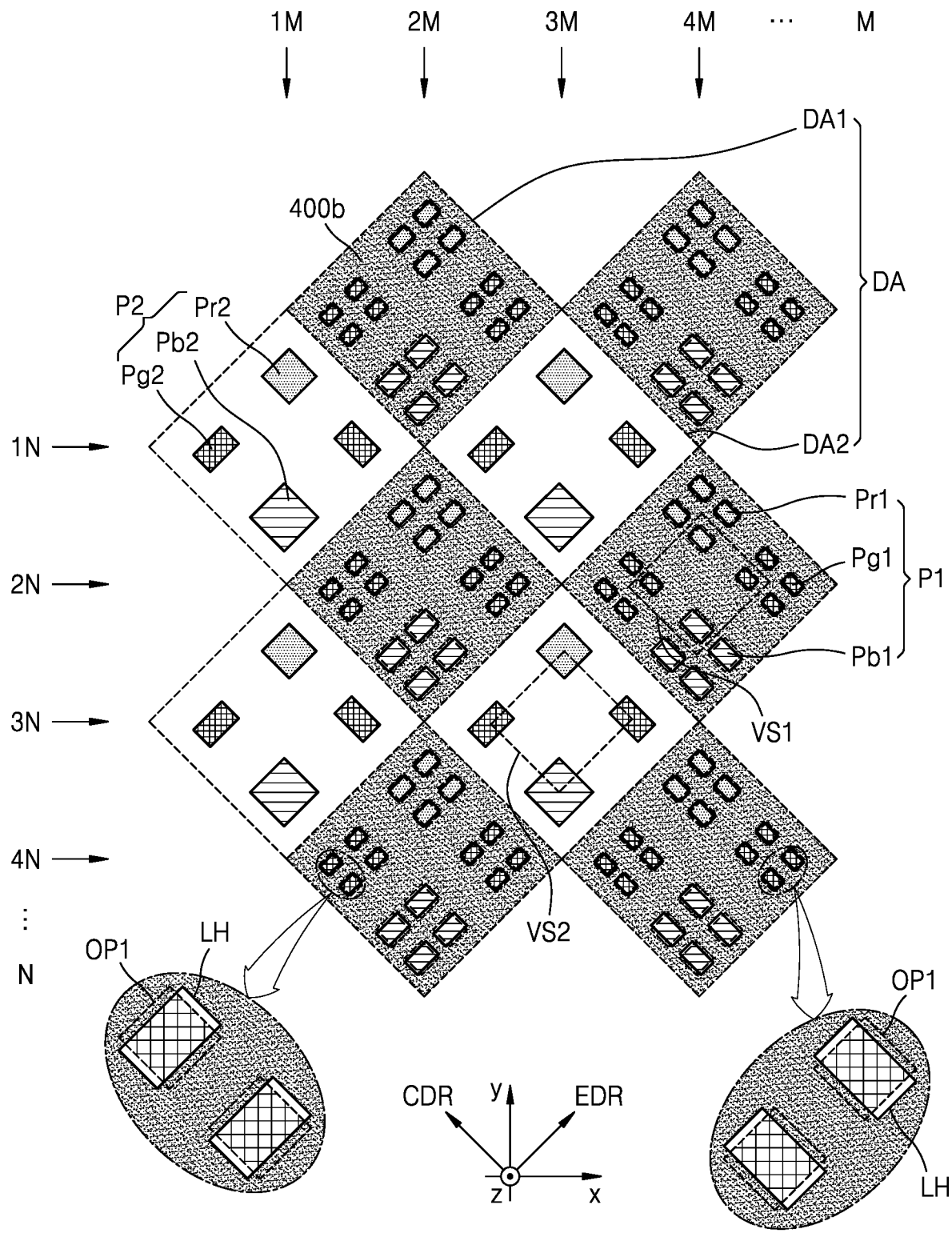
FIG. 10 is a schematic plan view of a display apparatus according to one or more embodiments.

FIG. 10 is a schematic plan view of a display apparatus according to one or more embodiments.

Referring to FIG. 10, a display area DA may include a first display area DA1 and a second display area DA2. Here, the first display area DA1 and the second display area DA2 may be arranged to be substantially the same as described above with reference to FIG. 5A.

A first sub-pixel P1 and a second sub-pixel P2 may be arranged in the first display area DA1 and the second display area DA2, respectively. Here, the second sub-pixel P2 may include a second red sub-pixel Pr2, a second green sub-pixel Pg2, and a second blue sub-pixel Pb2 and may be the same or substantially the same as described above with reference to FIG. 5A.

The first sub-pixel P1 may include a first red sub-pixel Pr1, a first green sub-pixel Pg1, and a first blue sub-pixel Pb1. Here, the first sub-pixel P1 may be arranged to be substantially the same as described above with reference to FIG. 7.

The shape and the arrangement of the first sub-pixel P1 may be substantially the same as illustrated in FIG. 9. Here, the shape and the arrangement of the first sub-pixel P1 arranged in a second column M2 may be the same as the shape and the arrangement of the first sub-pixel P1 arranged in a fourth column M4 of FIG. 9, and the shape and the arrangement of the first sub-pixel P1 arranged in a fourth column M4 may be the same as the shape and the arrangement of the first sub-pixel P1 arranged in a second column M2 of FIG. 9.

In this case, the relationship of the first opening portion OP1 and the hole LH may be the same as described above.

Figure 11A:
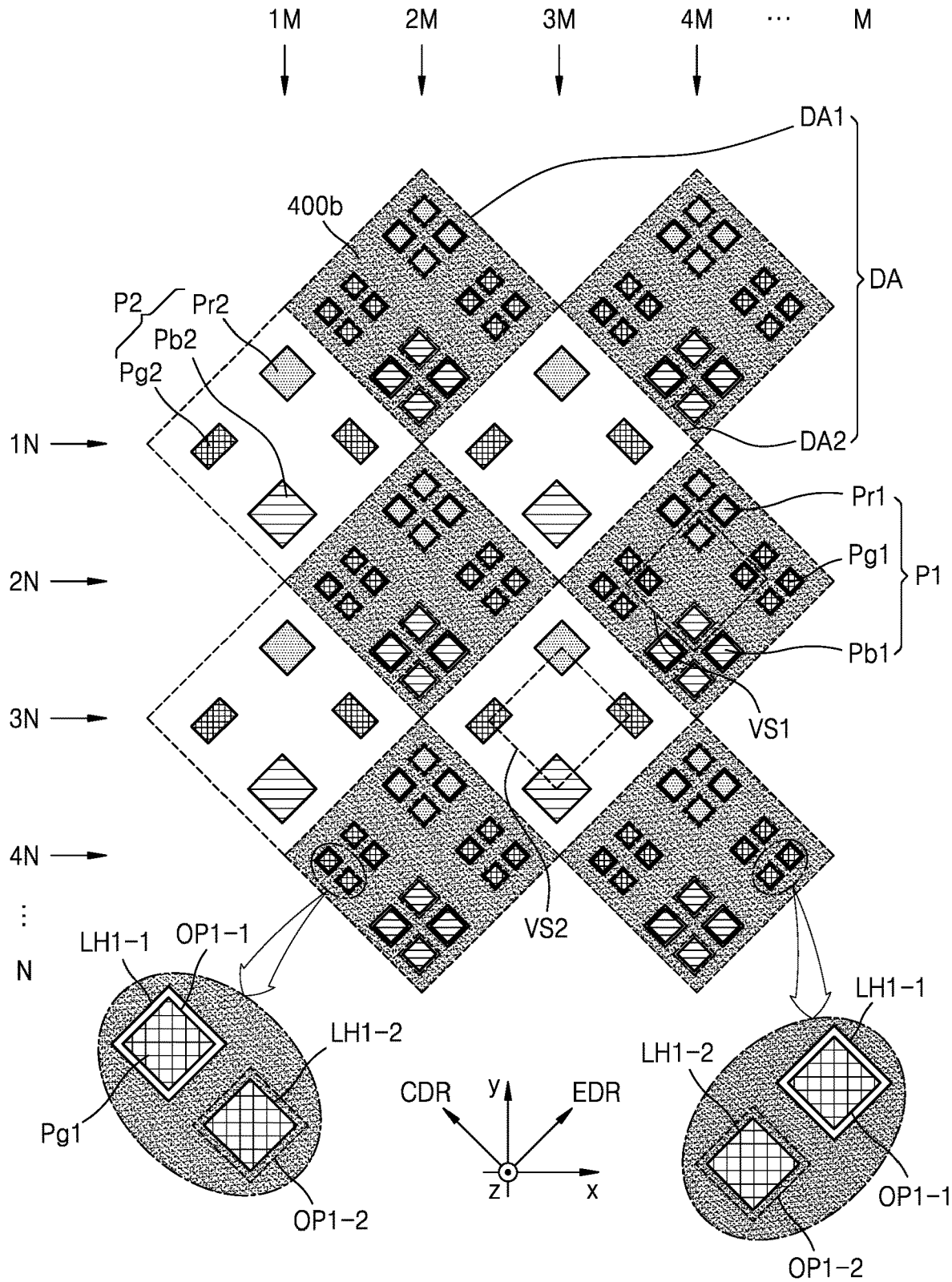
FIG. 11A is a schematic plan view of a display apparatus according to one or more embodiments.

FIG. 11A is a schematic plan view of a display apparatus according to one or more embodiments.

Referring to FIG. 11A, a display area DA may include a first display area DA1 and a second display area DA2. Here, the first display area DA1 and the second display area DA2 may be arranged to be substantially the same as described above with reference to FIG. 5A.

A first sub-pixel P1 and a second sub-pixel P2 may be arranged in the first display area DA1 and the second display area DA2, respectively. Here, the first sub-pixel P1 may include a first red sub-pixel Pr1, a first green sub-pixel Pg1, and a first blue sub-pixel Pb1. The second sub-pixel P2 may include a second red sub-pixel Pr2, a second green sub-pixel Pg2, and a second blue sub-pixel Pb2. Here, the second sub-pixel P2 may be the same as described above with reference to FIG. 5A, and thus, its detailed description is omitted.

The first red sub-pixel Pr1, the first green sub-pixel Pg1, and the first blue sub-pixel Pb1 may have a diamond or square shape. Here, the first red sub-pixel Pr1, the first green sub-pixel Pg1, and the first blue sub-pixel Pb1 may be the same or substantially the same as one another, and thus, the first green sub-pixel Pg1 is primarily described in more detail, and a case in which the first green sub-pixel Pg1 has a diamond shape is primarily described in more detail.

The first green sub-pixel Pg1 arranged in a unit first display area DA1 may have a diamond shape. In this case, the planar shapes of the first opening portion OP1 and the hole LH arranged to correspond to the plurality of first green sub-pixels Pg1 arranged in the unit first display area DA1 may be a diamond. Here, a size of the first opening portion OP1 corresponding to some of the plurality of first green sub-pixels Pg1 arranged in the unit first display area DA1 may be different from a size of the first opening portion OP1 corresponding to the others of the plurality of first green sub-pixels Pg1 arranged in the unit first display area DA1. Also, a size of the hole LH corresponding to some of the plurality of first green sub-pixels Pg1 arranged in the unit first display area DA1 may be different from a size of the hole LH corresponding to the others of the plurality of first green sub-pixels Pg1 arranged in the unit first display area DA1.

For example, the size of a 1-1st opening portion OP1-1 corresponding to one of the plurality of first green sub-pixels Pg1 arranged in the unit first display area DA1 may be less than the size of a 1-2nd opening portion OP1-2 corresponding to another of the plurality of first green sub-pixels Pg1. Also, the size of a 1-1st hole LH1-1 corresponding to one of the plurality of first green sub-pixels Pg1 arranged in the unit first display area DA1 may be greater than the size of a 1-2nd hole LH1-2 corresponding to another of the plurality of first green sub-pixels Pg1.

In this case, the 1-1st opening portion OP1-1 corresponding to one of the plurality of first green sub-pixels Pg1 arranged in the unit first display area DA1 may be arranged in the 1-1st hole LH1-1 in a plan view. Also, the 1-2nd hole LH1-2 corresponding to the other of the plurality of first green sub-pixels Pg1 arranged in the unit first display area DA1 may be arranged in the 1-2nd opening portion OP1-2 in a plan view. In particular, in this case, shapes and areas of all of the first green sub-pixels Pg1 each being defined by a portion at which the first opening portion OP1 and the hole LH overlap each other may be the same in a plan view.

Thus, in this case, even when a location of a center of the first opening portion OP1 and a location of a center of the hole LH are slightly misaligned in a plan view, a desired level (e.g., a predetermined level) of brightness may be secured in the first display area DA1. In addition, it is possible to maintain the level of brightness to be 10% or less than 10% when the first display area DA1 is seen at an angle (e.g., a predetermined angle) (e.g., 45 degrees or 135 degrees with respect to a y direction or an x direction) when the first display area DA1 operates.

Figure 11B:
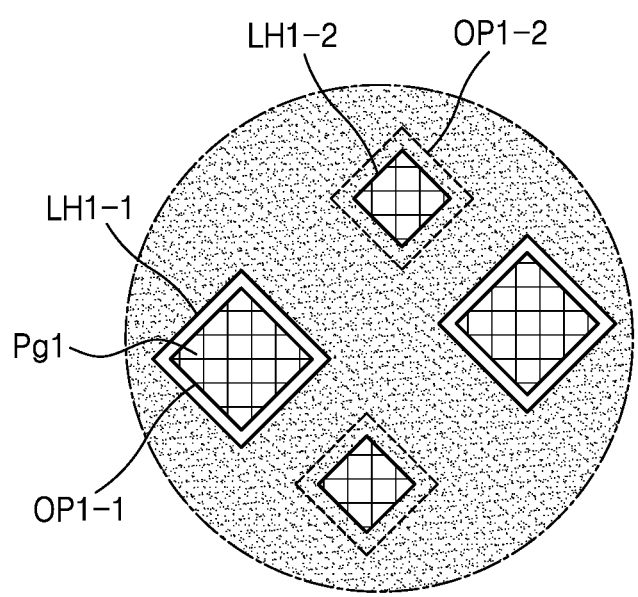
FIG. 11B is a schematic plan view of a first green sub-pixel arranged in a first display area of a display apparatus according to one or more embodiments.

FIG. 11B is a schematic plan view of a first green sub-pixel arranged in a first display area of a display apparatus according to one or more embodiments.

Referring to FIG. 11B, a size of the 1-1st opening portion OP1-1 corresponding to some of a plurality of first green sub-pixels Pg1 arranged in a unit first display area DA1 may be the same as a size of the 1-2nd opening portion OP1-2 corresponding to the others of the plurality of first green sub-pixels Pg1 arranged in the unit first display area DA1. In one or more embodiments, a size of a 1-1st hole LH-1 corresponding to some of the plurality of first green sub-pixel Pg1 arranged in the unit first display area DA1 may be different from a size of a 1-2nd hole LH-2 corresponding to the others of the plurality of first green sub-pixel Pg1 arranged in the unit first display area DA1. For example, the size of the 1-1st hole LH1-1 may be greater than the size of the 1-2nd hole LH1-2. Here, in a plan view, the size of the 1-1st opening portion OP1-1 may be less than the size of the 1-1st hole LH1-1, and the size of the 1-2nd opening portion OP1-2 may be greater than the size of the 1-2nd hole LH1-2. In this case, the 1-2nd hole LH1-2 may be arranged in the 1-2nd opening portion OP1-2, and the 1-1st opening portion OP1-1 may be arranged in the 1-1st hole LH1-1.

In this case, in a plan view, a size of the first green sub-pixel Pg1 corresponding to the 1-1st opening portion OP1-1 may be greater than a size of the first green sub-pixel Pg1 corresponding to the 1-2nd opening portion OP1-2.

Thus, in this case, the first green sub-pixels Pg1 arranged in the first display area DA1 may provide a user with an image having a desired level (e.g., a predetermined level) of brightness and may provide others, etc. beside the user with an image having a limited or lower level of brightness.

Figure 12:
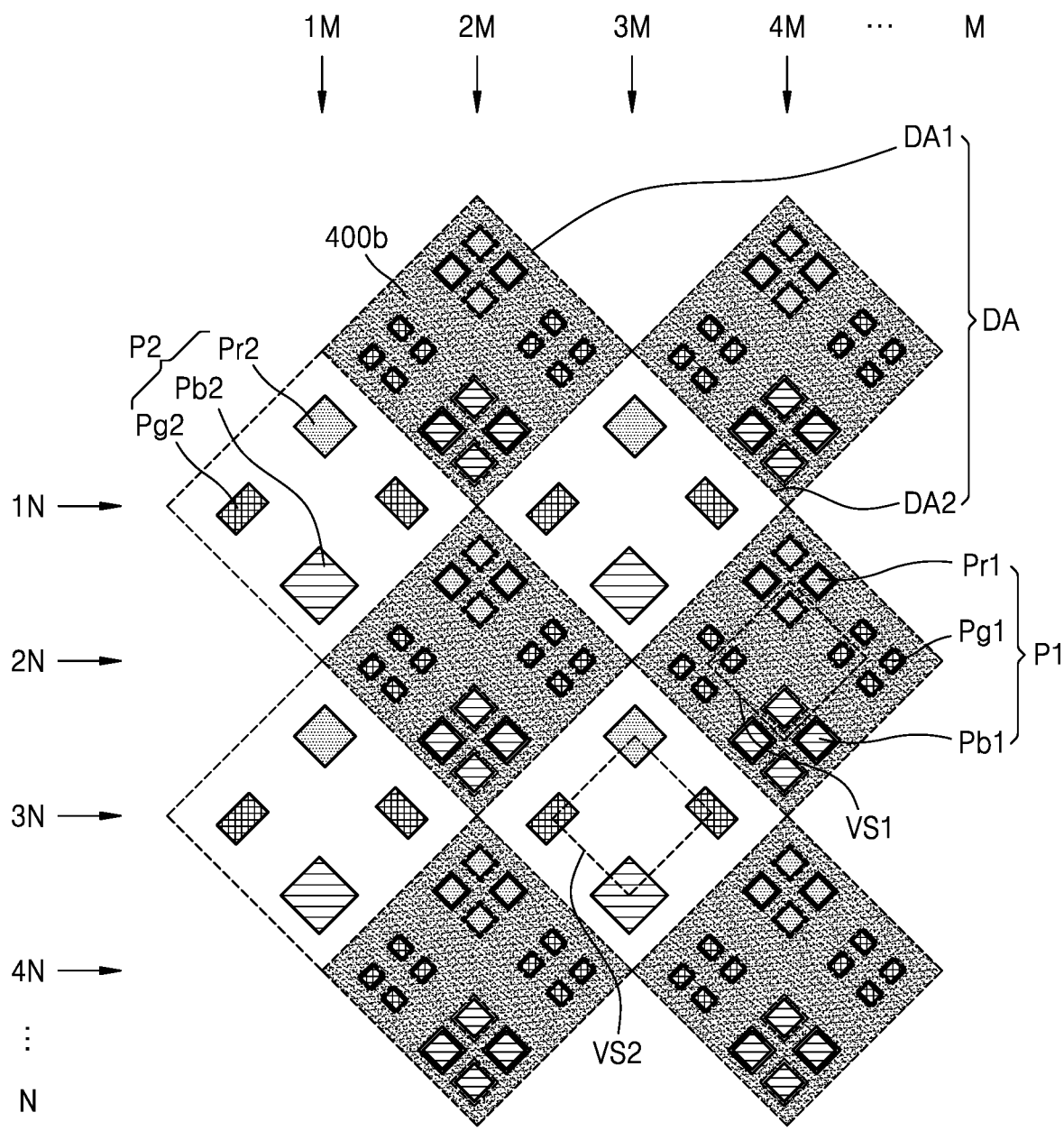
FIG. 12 is a schematic plan view of a display apparatus according to one or more embodiments.

FIG. 12 is a schematic plan view of a display apparatus according to one or more embodiments.

Referring to FIG. 12, a display area DA may include a first display area DA1 and a second display area DA2. Here, the first display area DA1 and the second display area DA2 may be arranged to be the same as described above with reference to FIG. 5A.

A first sub-pixel P1 and a second sub-pixel P2 may be arranged in the first display area DA1 and the second display area DA2, respectively. Here, the first sub-pixel P1 may include a first red sub-pixel Pr1, a first green sub-pixel Pg1, and a first blue sub-pixel Pb1. The second sub-pixel P2 may include a second red sub-pixel Pr2, a second green sub-pixel Pg2, and a second blue sub-pixel Pb2. Here, the second sub-pixel P2 may be the same as described above with reference to FIG. 5A, and thus, a detailed description thereof may be omitted.

In this case, one of the first sub-pixels P1 may have a rectangular shape, and the rest of the first sub-pixels P1 may have a diamond or square shape. For example, one of the first red sub-pixel Pr1, the first green sub-pixel Pg1, and the first blue sub-pixel Pb1 may have a rectangular shape, and the rest of the first red sub-pixel Pr1, the first green sub-pixel Pg1, and the first blue sub-pixel Pb1 may have a square or diamond shape. However, the present disclosure is not limited thereto. Hereinafter, for convenience of explanation, a case in which the first green sub-pixel Pg1 has a rectangular shape, and the first red sub-pixel Pr1 and the first blue sub-pixel Pb1 have a diamond shape is primarily described in more detail.

The first green sub-pixel Pg1 may be formed to have the same shape as illustrated in FIG. 5A. Here, a relationship of the first opening portion OP1 and the hole LH corresponding to the first green sub-pixel Pg1 may be the same as described with reference to FIG. 5A. The first red sub-pixel Pr1 and the first blue sub-pixel Pb1 may have the same shape as the first green sub-pixel Pg1 illustrated in FIG. 11A or 11B. Here, a relationship of the opening portion OP1 of the pixel-defining layer 225 and the hole LH of the light blocking layer 400b corresponding to each of the first red sub-pixel Pr1 and the first blue sub-pixel Pb1 may be the same or substantially the same as described with reference to FIG. 11A or 11B.

Figure 13:
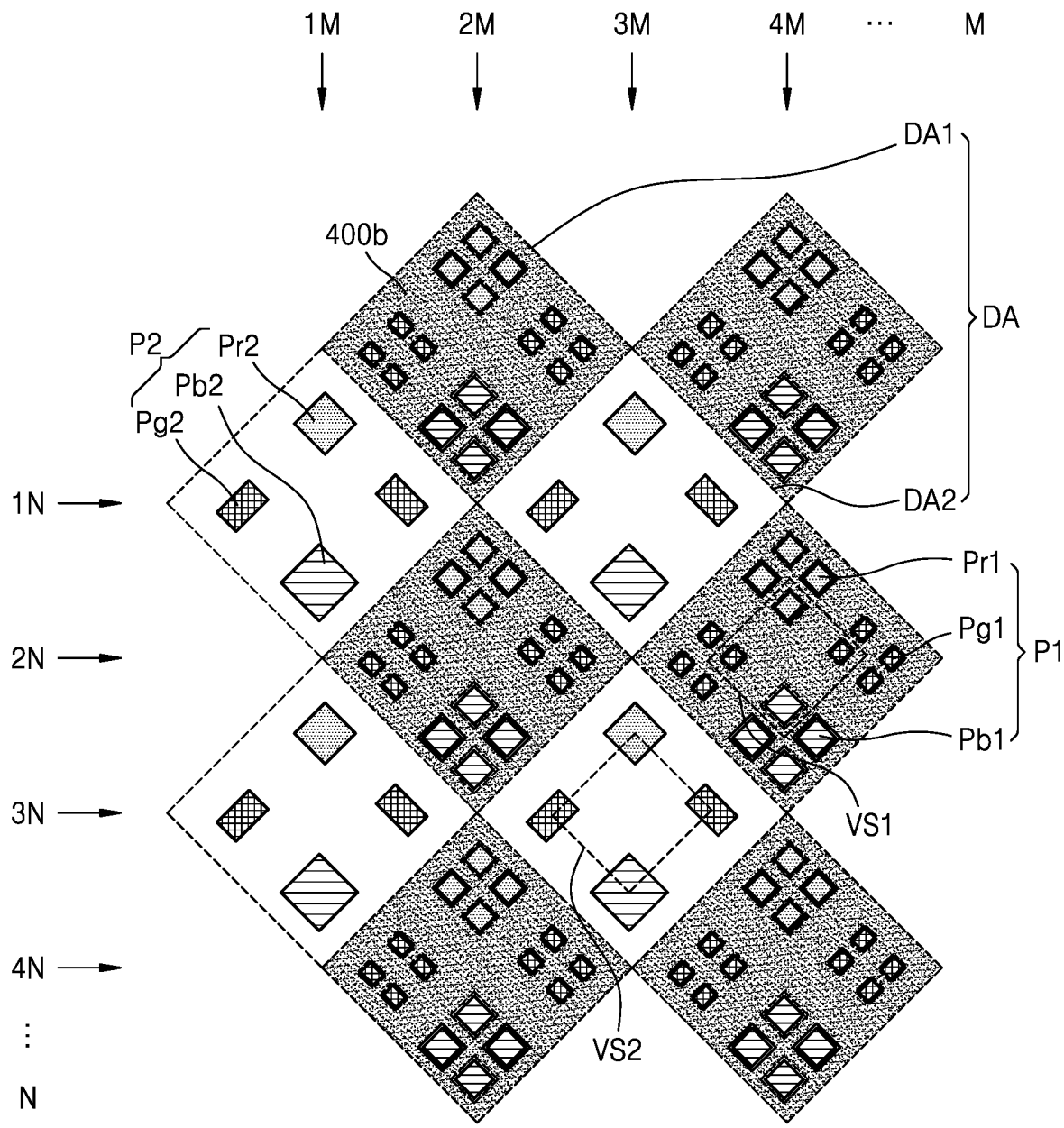
FIG. 13 is a schematic plan view of a display apparatus according to one or more embodiments.

FIG. 13 is a schematic plan view of a display apparatus according to one or more embodiments.

Referring to FIG. 13, a display area DA may include a first display area DA1 and a second display area DA2. Here, the first display area DA1 and the second display area DA2 may be arranged to be substantially the same as described above with reference to FIG. 5A.

A first sub-pixel P1 and a second sub-pixel P2 may be arranged in the first display area DA1 and the second display area DA2, respectively. Here, the first sub-pixel P1 may include a first red sub-pixel Pr1, a first green sub-pixel Pg1, and a first blue sub-pixel Pb1. The second sub-pixel P2 may include a second red sub-pixel Pr2, a second green sub-pixel Pg2, and a second blue sub-pixel Pb2. Here, the second sub-pixel P2 may be the same as described above with reference to FIG. 5A, and thus, a detailed description thereof may be omitted.

In this case, one of the first sub-pixels P1 may have a rectangular shape, and the rest of the first sub-pixels P1 may have a diamond or square shape. For example, one of the first red sub-pixel Pr1, the first green sub-pixel Pg1, and the first blue sub-pixel Pb1 may have a rectangular shape, and the rest of the first red sub-pixel Pr1, the first green sub-pixel Pg1, and the first blue sub-pixel Pb1 may have a square or diamond shape. However, the present disclosure is not limited thereto. Hereinafter, for convenience of explanation, a case in which the first green sub-pixel Pg1 has a rectangular shape, and the first red sub-pixel Pr1 and the first blue sub-pixel Pb1 have a diamond shape is primarily described in more detail.

The first green sub-pixel Pg1 may be formed to have the same shape as illustrated in FIG. 6. Here, a relationship of the first opening portion OP1 and the hole LH corresponding to the first green sub-pixels Pg1 may be substantially the same as described with reference to FIG. 6. The first red sub-pixel Pr1 and the first blue sub-pixel Pb1 may have the same shape as the first green sub-pixel Pg1 illustrated in FIG. 11A or 11B. Here, a relationship of the opening portion OP1 of the pixel-defining layer 225 and the hole LH of the light blocking layer 400b corresponding to each of the first red sub-pixel Pr1 and the first blue sub-pixel Pb1 may be the same or substantially the same as described with reference to FIG. 11A or 11B.

Figure 14:
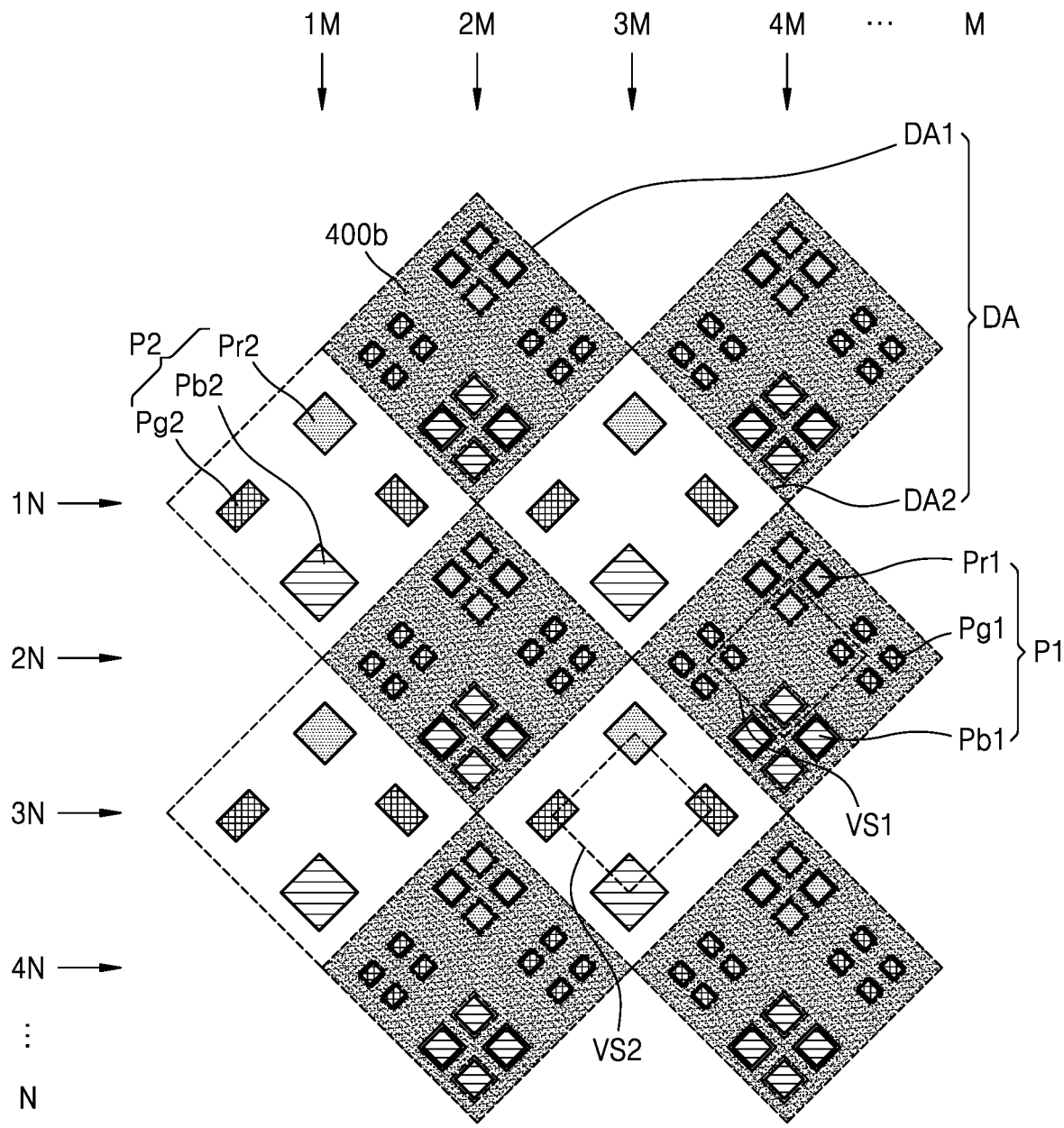
FIG. 14 is a schematic plan view of a display apparatus according to one or more embodiments.

FIG. 14 is a schematic plan view of a display apparatus according to one or more embodiments.

Referring to FIG. 14, a display area DA may include a first display area DA1 and a second display area DA2. Here, the first display area DA1 and the second display area DA2 may be arranged to be substantially the same as described above with reference to FIG. 5A.

A first sub-pixel P1 and a second sub-pixel P2 may be arranged in the first display area DA1 and the second display area DA2, respectively. Here, the first sub-pixel P1 may include a first red sub-pixel Pr1, a first green sub-pixel Pg1, and a first blue sub-pixel Pb1. The second sub-pixel P2 may include a second red sub-pixel Pr2, a second green sub-pixel Pg2, and a second blue sub-pixel Pb2. Here, the second sub-pixel P2 may be the same as described above with reference to FIG. 5A, and thus, a detailed description thereof may be omitted.

In this case, one of the first sub-pixels P1 may have a rectangular shape, and the rest of the first sub-pixels P1 may have a diamond or square shape. For example, one of the first red sub-pixel Pr1, the first green sub-pixel Pg1, and the first blue sub-pixel Pb1 may have a rectangular shape, and the rest of the first red sub-pixel Pr1, the first green sub-pixel Pg1, and the first blue sub-pixel Pb1 may have a square or diamond shape. However, the present disclosure is not limited thereto. Hereinafter, for convenience of explanation, a case in which the first green sub-pixel Pg1 has a rectangular shape, and the first red sub-pixel Pr1 and the first blue sub-pixel Pb1 have a diamond shape is primarily described in more detail.

The first green sub-pixel Pg1 may be formed to have the same shape as illustrated in FIG. 7. Here, a relationship of the first opening portion OP1 and the hole LH corresponding to the first green sub-pixels Pg1 may be the same as described with reference to FIG. 7. The first red sub-pixel Pr1 and the first blue sub-pixel Pb1 may have the same shape as the first green sub-pixel Pg1 illustrated in FIG. 11A or 11B. Here, a relationship of the opening portion OP1 of the pixel-defining layer 225 and the hole LH of the light blocking layer 400b corresponding to each of the first red sub-pixel Pr1 and the first blue sub-pixel Pb1 may be the same or substantially the same as described with reference to FIG. 11A or 11B.

Figure 15:
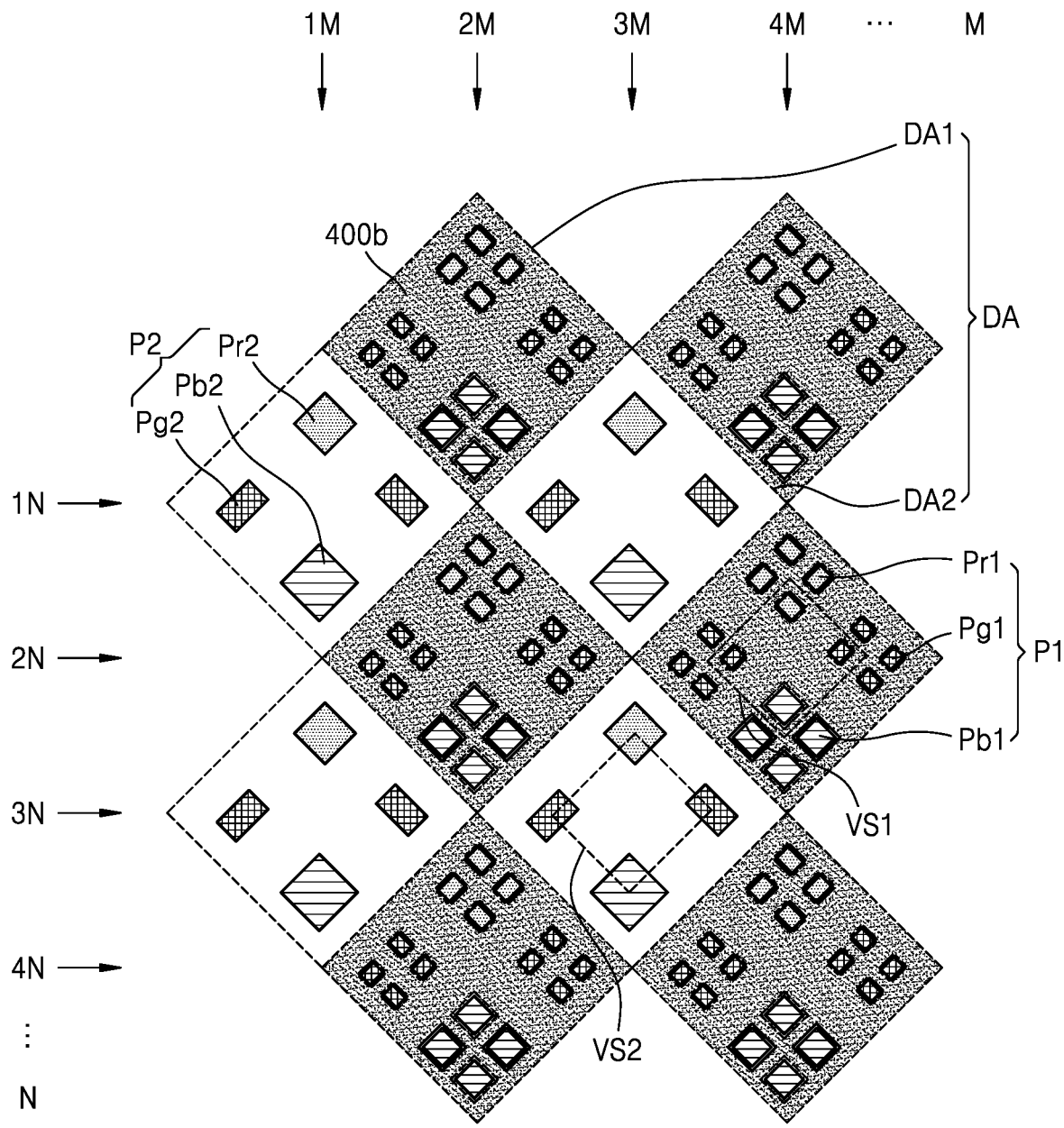
FIG. 15 is a schematic plan view of a display apparatus according to one or more embodiments.

FIG. 15 is a schematic plan view of a display apparatus according to one or more embodiments.

Referring to FIG. 15, a display area DA may include a first display area DA1 and a second display area DA2. Here, the first display area DA1 and the second display area DA2 may be arranged to be substantially the same as described above with reference to FIG. 5A.

A first sub-pixel P1 and a second sub-pixel P2 may be arranged in the first display area DA1 and the second display area DA2, respectively. Here, the first sub-pixel P1 may include a first red sub-pixel Pr1, a first green sub-pixel Pg1, and a first blue sub-pixel Pb1. The second sub-pixel P2 may include a second red sub-pixel Pr2, a second green sub-pixel Pg2, and a second blue sub-pixel Pb2. Here, the second sub-pixel P2 may be the same as described above with reference to FIG. 5A, and thus, a detailed description thereof may be omitted.

In this case, two or more of the first sub-pixels P1 may have a rectangular shape, and the rest of the first sub-pixels P1 may have a diamond or square shape. For example, two of the first red sub-pixel Pr1, the first green sub-pixel Pg1, and the first blue sub-pixel Pb1 may have a rectangular shape, and the rest one of the first red sub-pixel Pr1, the first green sub-pixel Pg1, and the first blue sub-pixel Pb1 may have a square or diamond shape. However, the present disclosure is not limited thereto. Hereinafter, for convenience of explanation, a case in which the first red sub-pixel Pr1 and the first green sub-pixel Pg1 have a rectangular shape, and the first blue sub-pixel Pb1 has a diamond shape is primarily described in more detail.

The first green sub-pixel Pg1 and the first red sub-pixel Pr1 may be formed to have the same shape as illustrated in FIG. 5A. Here, a relationship of the first opening portion OP1 and the hole LH corresponding to the first green sub-pixel Pg1 and a relationship of the opening portion OP1 and the hole LH corresponding to the first red sub-pixel Pr1 may be the same as described with reference to FIG. 5A. The first blue sub-pixel Pb1 may have the same shape as the first green sub-pixel Pg1 illustrated in FIG. 11A or 11B. Here, a relationship of the opening portion OP1 of the pixel-defining layer 225 and the hole LH of the light blocking layer 400*b* corresponding to the first blue sub-pixel Pb1 may be the same or substantially the same as described with reference to FIG. 11A or 11B.

Figure 16:
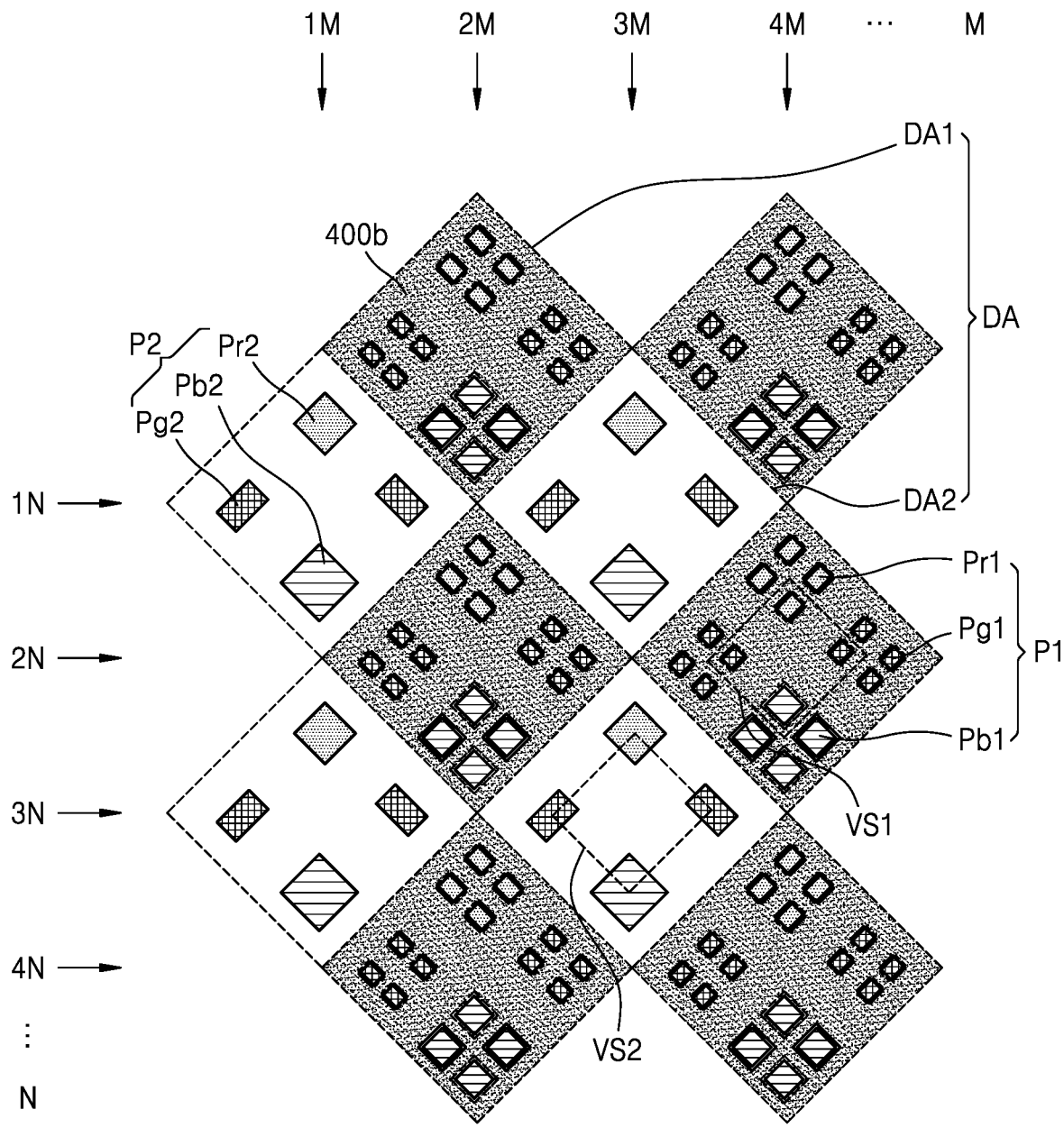
FIG. 16 is a schematic plan view of a display apparatus according to one or more embodiments.

FIG. 16 is a schematic plan view of a display apparatus according to one or more embodiments.

Referring to FIG. 16, a display area DA may include a first display area DA1 and a second display area DA2. Here, the first display area DA1 and the second display area DA2 may be arranged to be substantially the same as described above with reference to FIG. 5A.

A first sub-pixel P1 and a second sub-pixel P2 may be arranged in the first display area DA1 and the second display area DA2, respectively. Here, the first sub-pixel P1 may include a first red sub-pixel Pr1, a first green sub-pixel Pg1, and a first blue sub-pixel Pb1. The second sub-pixel P2 may include a second red sub-pixel Pr2, a second green sub-pixel Pg2, and a second blue sub-pixel Pb2. Here, the second sub-pixel P2 may be the same as described above with reference to FIG. 5A, and thus, a detailed description thereof may be omitted.

In this case, two or more of the first sub-pixels P1 may have a rectangular shape, and the rest of the first sub-pixels P1 may have a diamond or square shape. For example, two of the first red sub-pixel Pr1, the first green sub-pixel Pg1, and the first blue sub-pixel Pb1 may have a rectangular shape, and the rest one of the first red sub-pixel Pr1, the first green sub-pixel Pg1, and the first blue sub-pixel Pb1 may have a square or diamond shape. However, the present disclosure is not limited thereto. Hereinafter, for convenience of explanation, a case in which the first red sub-pixel Pr1 and the first green sub-pixel Pg1 have a rectangular shape, and the first blue sub-pixel Pb1 has a diamond shape is primarily described in more detail.

The first green sub-pixel Pg1 and the first red sub-pixel Pr1 may be formed to have the same shape as illustrated in FIG. 6. Here, a relationship of the first opening portion OP1 and the hole LH corresponding to the first green sub-pixel Pg1 and a relationship of the opening portion OP1 and the hole LH corresponding to the first red sub-pixel Pr1 may be the same as described with reference to FIG. 6. The first blue sub-pixel Pb1 may have the same shape as the first green sub-pixel Pg1 illustrated in FIG. 11A or 11B. Here, a relationship of the opening portion OP1 of the pixel-defining layer 225 and the hole LH of the light blocking layer 400*b* corresponding to the first blue sub-pixel Pb1 may be the same or substantially the same as described with reference to FIG. 11A or 11B.

Figure 17:
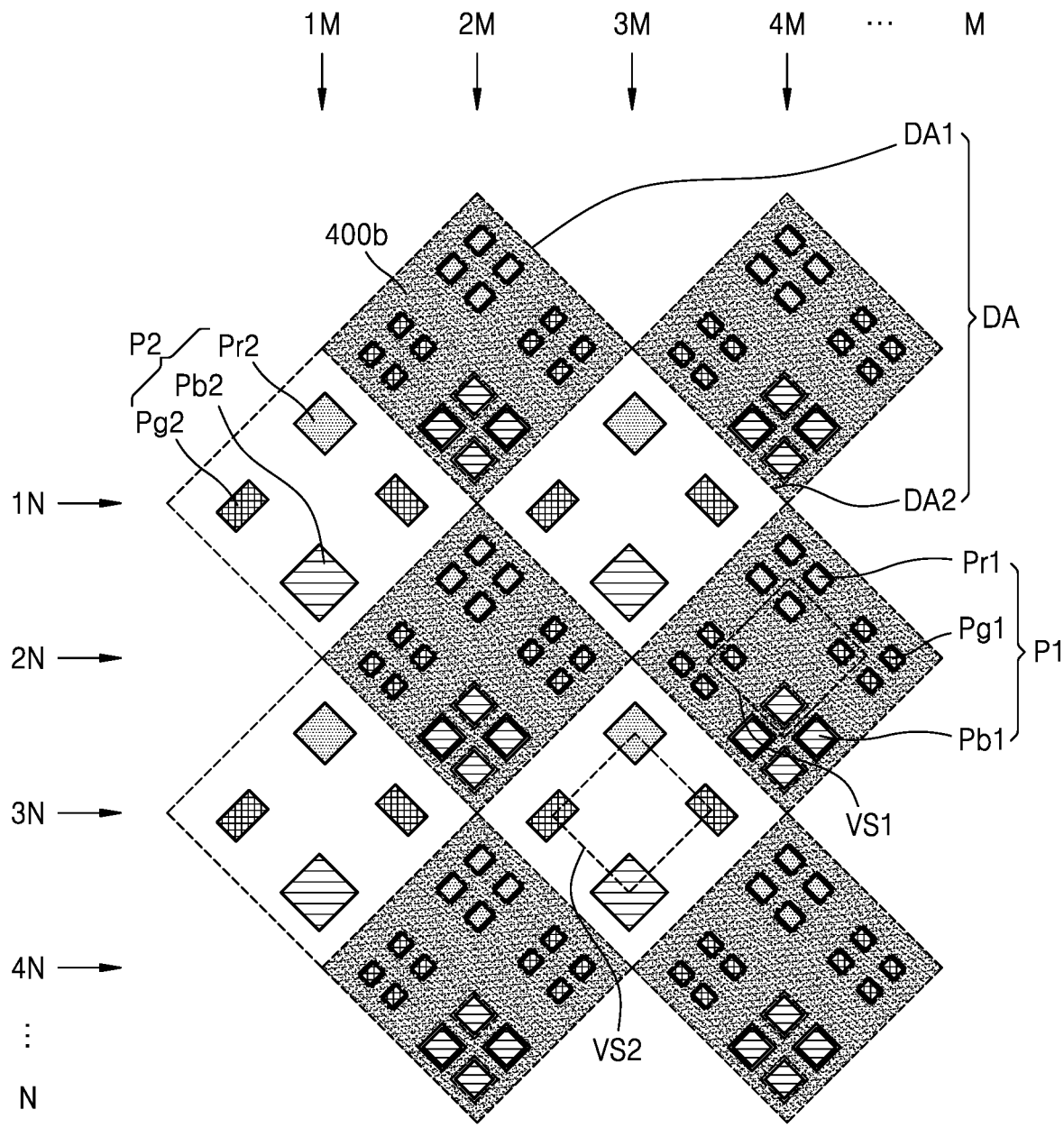
FIG. 17 is a schematic plan view of a display apparatus according to one or more embodiments.

FIG. 17 is a schematic plan view of a display apparatus according to one or more embodiments.

Referring to FIG. 17, a display area DA may include a first display area DA1 and a second display area DA2. Here, the first display area DA1 and the second display area DA2 may be arranged to be substantially the same as described above with reference to FIG. 5A.

A first sub-pixel P1 and a second sub-pixel P2 may be arranged in the first display area DA1 and the second display area DA2, respectively. Here, the first sub-pixel P1 may include a first red sub-pixel Pr1, a first green sub-pixel Pg1, and a first blue sub-pixel Pb1. The second sub-pixel P2 may include a second red sub-pixel Pr2, a second green sub-pixel Pg2, and a second blue sub-pixel Pb2. Here, the second sub-pixel P2 may be the same as described above with reference to FIG. 5A, and thus, a detailed description thereof may be omitted.

In this case, two or more of the first sub-pixels P1 may have a rectangular shape, and the rest of the first sub-pixels P1 may have a diamond or square shape. For example, two of the first red sub-pixel Pr1, the first green sub-pixel Pg1, and the first blue sub-pixel Pb1 may have a rectangular shape, and the rest one of the first red sub-pixel Pr1, the first green sub-pixel Pg1, and the first blue sub-pixel Pb1 may have a square or diamond shape. However, the present disclosure is not limited thereto. Hereinafter, for convenience of explanation, a case in which the first red sub-pixel Pr1 and the first green sub-pixel Pg1 have a rectangular shape, and the first blue sub-pixel Pb1 has a diamond shape is primarily described in more detail.

The first green sub-pixel Pg1 and the first red sub-pixel Pr1 may be formed to have the same shape as illustrated in FIG. 7. Here, a relationship of the first opening portion OP1 and the hole LH corresponding to the first green sub-pixel Pg1 and a relationship of the opening portion OP1 and the hole LH corresponding to the first red sub-pixel Pr1 may be the same as described with reference to FIG. 7. The first blue sub-pixel Pb1 may have the same shape as the first green sub-pixel Pg1 illustrated in FIG. 11A or 11B. Here, a relationship of the opening portion OP1 of the pixel-defining layer 225 and the hole LH of the light blocking layer 400*b* corresponding to the first blue sub-pixel Pb1 may be the same or substantially the same as described with reference to FIG. 11A or 11B.

The shape of the first sub-pixels P1 is not limited to the description above. In more detail, at least one of the first green sub-pixel Pg1, the first red sub-pixel Pr1, or the first blue sub-pixel Pb1 arranged in a unit first display area DA1 may be formed to have the same shape as the first green sub-pixel Pg1 illustrated in one of FIGS. 5A, 6, 7, 11A, and 11B, and the rest of the first green sub-pixel Pg1, the first red sub-pixel Pr1, and the first blue sub-pixel Pb1 may have the same shape as the first green sub-pixel Pg1 illustrated in another of FIGS. 5A, 6, 7, 11A, and 11B.

According to one or more embodiments, at least one of the plurality of first display areas DA1 may be formed to have the same shape as one of the unit first display areas DA1 illustrated in one of FIGS. 5A, 6, 7, 11A, and 11B, and the rest of the plurality of first display areas DA1 may be formed to have the same shape as another of the unit first display areas DA1 illustrated in one of FIGS. 5A, 6, 7, 11A, and 11B.

As described above, a display apparatus according to one or more embodiments may prevent or reduce the sharing of information provided by the display apparatus with others.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by one of ordinary skill in the art that various changes in form and details may be made therein without departing from the spirit and scope as defined by the following claims, and equivalents thereof.

What is claimed is:

1. A display apparatus, wherein the display apparatus comprises:
    a substrate;
    a first display area arranged on the substrate; and
    a second display area arranged on the substrate,
    wherein the first display area comprises:
        a plurality of first pixel areas; and
        a plurality of first transmission areas respectively arranged to correspond to the plurality of first pixel areas to transmit light emitted from the plurality of first pixel areas, respectively,
    in a plan view, at least a portion of one of the plurality of first pixel areas is arranged to protrude from an edge of a planar shape of one of the plurality of first transmission areas, the one of the plurality of first transmission areas corresponding to the one of the plurality of first pixel areas,
    an area of a planar shape of each of the first pixel areas is different from an area of a planar shape of a second pixel area arranged on the second display area, the second pixel area emits a same color of light as the first pixel area,
    the first display area comprises a plurality of first display areas, and
    the second display area comprises a plurality of second display areas alternately arranged with the plurality of first display areas in a row.

2. The display apparatus of claim 1, wherein, in the plan view, the first transmission areas or the first pixel areas have a rectangular shape.

3. The display apparatus of claim 1, wherein, in the plan view, the first transmission areas or the first pixel areas have a rectangular shape, a square shape or a diamond shape.

4. The display apparatus of claim 1, wherein, in the plan view, the first pixel areas have a square shape or a diamond shape, and the first transmission areas have a rectangular shape.

5. The display apparatus of claim 4, wherein, in the plan view, one of the plurality of first pixel areas protrudes from an edge of the first transmission area corresponding to the one of the plurality of first pixel areas in a first direction, and another of the plurality of first pixel areas protrudes from an edge of the first transmission area corresponding to the other of the plurality of first pixel areas in a second direction.

6. The display apparatus of claim 1, wherein the first pixel areas and the first transmission areas each have a square shape or a diamond shape, and
    wherein, in the plan view, one of the plurality of first pixel areas protrudes from an edge of the first transmission area corresponding to the one of the plurality of first pixel areas in a first direction and a second direction.

7. The display apparatus of claim 6, wherein, in the plan view, an-other of the plurality of first pixel areas is arranged in the first transmission area corresponding to another of the plurality of first pixel areas.

8. The display apparatus of claim 1, wherein four of the plurality of first display areas are arranged around, and adjacent to, one of the plurality of second display areas.

9. The display apparatus of claim 1, wherein the second display area is adjacent to the first display area.

10. The display apparatus of claim 1, wherein, in the plan view, the first pixel areas respectively arranged on the first display areas respectively protrude from edges of the first transmission areas respectively arranged to correspond to the first pixel areas, in a same direction.

11. The display apparatus of claim 1, wherein, in the plan view, the first pixel areas respectively arranged on the first display areas adjacent to each other respectively protrude from edges of the first transmission areas respectively arranged to correspond to the first pixel areas, in different directions from each other.

12. The display apparatus of claim 1, wherein, in the plan view, the first pixel areas have a rectangular shape, and
    wherein the first transmission areas have a square shape or a diamond shape.

13. The display apparatus of claim 12, wherein, in the plan view, one of the plurality of first pixel areas protrudes in a first direction from an edge of the first transmission area corresponding to the one of the plurality of first pixel areas, and another of the plurality of first pixel areas protrudes in a second direction from an edge of the first transmission area corresponding to the other of the plurality of first pixel areas.

14. A display apparatus, wherein the display apparatus comprises:
    a substrate including a first display area and a second display area;
    a pixel-defining layer arranged on the substrate, the pixel-defining layer including at least one first opening portion arranged in the first display area and a plurality of second opening portions arranged in the second display area; and
    a light blocking layer arranged on the pixel-defining layer, the light blocking layer including one or more holes corresponding to the at least one first opening portion and an opening area corresponding to the second display area,
    wherein, in a plan view, a size of the at least one first opening portion and a size of the one or more holes are different from each other, and at least one of edges of the at least one first opening portion is arranged outside at least one of edges of the one or more holes.

15. The display apparatus of claim 14, wherein, in the plan view, the at least one first opening portion or the one or more holes have a rectangular shape.

16. The display apparatus of claim 14, wherein, in the plan view, the at least one first opening portion or the one or more holes have a rectangular shape, a square shape or a diamond shape.

17. The display apparatus of claim 14, wherein, in the plan view, one of the at least one first opening portion and the one or more holes has a rectangular shape, and the other of the at least one first opening portion and the one or more holes has a square shape,
    wherein the at least one first opening portion arranged in the first display area comprises a plurality of first opening portions,
    wherein some of edges of one of the plurality of first opening portions arranged in the first display area are more outwardly arranged in a first direction than some of edges of one of the one or more holes, the one of the one or more holes corresponding to the one of the plurality of first opening portions, and
    wherein some of edges of another of the plurality of first opening portions arranged in the first display area are more outwardly arranged in a second direction than some of edges of another of the one or more holes, the other of the one or more holes corresponding to the other of the plurality of first opening portions.

18. The display apparatus of claim 14, wherein the at least one first opening portion arranged in the first display area comprises a plurality of first opening portions, wherein, in the plan view, each of the plurality of first opening portions and each of the one or more holes have a square shape or a diamond shape, and an edge of one of the plurality of first opening portions is arranged in an edge of a first hole from among the one or more holes, the first hole corresponding to the one of the plurality of first opening portions.

19. The display apparatus of claim 18, wherein, in the plan view, an edge of another of the plurality of first opening portions is arranged outside an edge of a second hole from among the one or more holes, the second hole corresponding to the other of the plurality of first opening portions.

20. The display apparatus of claim 14, wherein, in the plan view, the plurality of second opening portions are arranged in the opening area.

* * * * *